(12) United States Patent
Lefebvre et al.

(10) Patent No.: US 10,941,055 B2
(45) Date of Patent: Mar. 9, 2021

(54) PHOTOELECTROCHEMICAL CELL FOR WASTEWATER TREATMENT AND METHOD OF FABRICATING THE PHOTOELECTROCHEMICAL CELL

(71) Applicant: National University of Singapore, Singapore (SG)

(72) Inventors: Olivier Patrick Lefebvre, Singapore (SG); Emmanuel Mousset, Singapore (SG); Zuxin Wang, Singapore (SG)

(73) Assignee: NATIONAL UNIVERSITY OF SINGAPORE, Singapore (SG)

( * ) Notice: Subject to any disclaimer, the term of this patent is extended or adjusted under 35 U.S.C. 154(b) by 84 days.

(21) Appl. No.: 16/099,037

(22) PCT Filed: May 5, 2017

(86) PCT No.: PCT/SG2017/050236
§ 371 (c)(1),
(2) Date: Nov. 5, 2018

(87) PCT Pub. No.: WO2017/192101
PCT Pub. Date: Nov. 9, 2017

(65) Prior Publication Data
US 2019/0194041 A1   Jun. 27, 2019

Related U.S. Application Data

(60) Provisional application No. 62/332,563, filed on May 6, 2016.

(51) Int. Cl.
*C02F 1/32* (2006.01)
*C02F 1/461* (2006.01)
(Continued)

(52) U.S. Cl.
CPC .......... *C02F 1/46104* (2013.01); *B33Y 10/00* (2014.12); *B33Y 80/00* (2014.12);
(Continued)

(58) Field of Classification Search
CPC .. C02F 1/32; C02F 1/461; C02F 1/467; C02F 1/70; C02F 1/72; C02F 101/30;
(Continued)

(56) References Cited

U.S. PATENT DOCUMENTS 5,439,577 A    8/1995  Weres et al.
6,077,431 A *  6/2000  Kawanishi ............... C02F 1/36
                                                    210/361

(Continued)

FOREIGN PATENT DOCUMENTS

CN   102092820 A   6/2011
CN   104638276 A   5/2015
(Continued)

OTHER PUBLICATIONS

Madhadik M. A. et al., "Oxidative degradation of industrial wastewater using spray deposited TiO2/Au:Fe2O3 bilayered thin films" (Journal of Photochemistry and Photobiology B: Biology, 141:315-324; Nov. 1, 2014) Abstract.

(Continued)

*Primary Examiner* — Cameron J Allen
(74) *Attorney, Agent, or Firm* — Thomas Horstemeyer, LLP

(57) ABSTRACT

According to the present disclosure, a photoelectrochemical cell for wastewater treatment is disclosed. A method of fabricating such a photoelectrochemical cell is also disclosed.

14 Claims, 13 Drawing Sheets

(51) Int. Cl.
  C02F 1/72 (2006.01)
  C02F 1/467 (2006.01)
  B33Y 10/00 (2015.01)
  B33Y 80/00 (2015.01)
  C02F 101/34 (2006.01)
  C02F 103/00 (2006.01)
  H01L 31/0224 (2006.01)
  C02F 101/30 (2006.01)
  C02F 103/08 (2006.01)
  C02F 103/10 (2006.01)

(52) U.S. Cl.
  CPC .............. C02F 1/32 (2013.01); C02F 1/467 (2013.01); C02F 1/4672 (2013.01); C02F 1/725 (2013.01); C02F 1/727 (2013.01); C02F 2001/46142 (2013.01); C02F 2101/30 (2013.01); C02F 2101/345 (2013.01); C02F 2103/002 (2013.01); C02F 2103/007 (2013.01); C02F 2103/08 (2013.01); C02F 2103/10 (2013.01); C02F 2201/009 (2013.01); C02F 2201/3228 (2013.01); C02F 2305/023 (2013.01); C02F 2305/026 (2013.01); C02F 2305/10 (2013.01); H01L 31/0224 (2013.01); Y02A 20/212 (2018.01); Y02W 10/37 (2015.05)

(58) Field of Classification Search
  CPC .... C02F 101/34; C02F 103/00; C02F 103/08; C02F 103/10; B33Y 10/00; B33Y 80/00; H01L 31/0224
  See application file for complete search history.

(56) References Cited

U.S. PATENT DOCUMENTS

| | | | | |
|---|---|---|---|---|
| 7,820,022 | B2* | 10/2010 | McNulty | C25B 1/003 204/242 |
| 2009/0114604 | A1* | 5/2009 | Bae | C02F 1/725 210/748.14 |
| 2017/0269096 | A1* | 9/2017 | Huang | G01N 33/50 |
| 2018/0031496 | A1* | 2/2018 | Kwon | C25D 17/12 |

FOREIGN PATENT DOCUMENTS

| | | |
|---|---|---|
| JP | 2010194472 A | 9/2010 |
| WO | 2012087427 A1 | 6/2012 |

OTHER PUBLICATIONS

Bai J. et al., "A solar light driven dual photoelectrode photocatalytic fuel cell (PFC) for simultaneous wasterwater treatment and electricity generation" (Journal of Hazardous Materials, 311:51-62; Feb. 26, 2016) Abstract.
International Search Report (PCT/SG2017/050236, filed May 5, 2017).
1. Bessegato et al., "Enhanced photoelectrocatalytic degradation of an acid dye with boron-doped TiO2 nanotube anodes", Catalysis Today 240 (2015) 100-106.
2. Catanho et al. , "Photoelectrochemical treatment of the dye reactive red 198 using DSA1 electrodes ", Applied Catalysis B: Environmental 62 (2006) 193-200.
3. Daskalaki et al., "Solar light-induced photoelectrocatalytic degradation of bisphenol-A on TiO2/ITO film anode and BDD cathode", Catalysis Catalysis Today 209 (2013) 74-78.
4. Ding et al., "Design of a visible light driven photo-electrochemical/ electro-Fenton coupling oxidation system for wastewater treatment", Journal of Hazardous Materials 239-240 (2012) 233-240.
5. Esquivet et al., "Development of a TiO2 modified optical fiber electrode and its incorporation into a photoelectrochemical reactor for wastewater treatment Water", Water Research 4 3 ( 2 0 0 9 ) 3 5 9 3-3 6 0 3.
6. Garcia-Segura et al., "Solar photoelectrocatalytic degradation of Acid Orange 7 azo dye using a highly stable TiO2 photoanode synthesized by atmospheric plasma spray", Applied Catalysis B: Environmental 132-133 (2013) 142-150.
7. Garza-Campos et al., "Coupling of solar photoelectro-Fenton with a BDD anode and solar heterogeneous photocatalysis for the mineralization of the herbicide atrazine", Chemosphere, 97 (2014) 26-33.
8. Khataee et al., "Combined heterogeneous and homogeneous photodegradation of a dye using immobilized TiO2 nanophotocatalyst and modified graphite electrode with carbon nanotubes", Journal of Molecular Catalysis A: Chemical 363-64 (2012) 58-68.
9. Leary et al., "Carbonaceous nanomaterials for the enhancement of TiO2 photocatalysis", Carbon, 49 (2011) 741-772.
10. Natarajan et al., "Photocatalytic reactor based on UV-LED/TiO2 coated quartz tube for degradation of dyes", Chemical Engineering Journal 178 (2011) 40-49.
11. Xie et al., "Interactive oxidation of photoelectrocatalysis and electro-Fenton for azo dye degradation using TiO2—Ti mesh and reticulated vitreous carbon electrodes", Materials Chemistry and Physics 95 (2006) 39-50.
12. Zhai et al., "Enhanced photoelectrocatalytic performance of titanium dioxide/carbon cloth based photoelectrodes by graphene modification under visible-light irradiation", Journal of Hazardous Materials 263 (2013) 291-298.

* cited by examiner

Air inlet with diffusion holes

PHOTOELECTROCHEMICAL CELL FOR WASTEWATER TREATMENT AND METHOD OF FABRICATING THE PHOTOELECTROCHEMICAL CELL

CROSS-REFERENCE TO RELATED APPLICATION

This application claims the benefit of priority of PCT Application No. PCT/SG2017/050236, filed on 5 May 2017, and U.S. Provisional Patent Application No. 62/332,563, filed on 6 May 2016, the content of it being hereby incorporated by reference in its entirety for all purposes.

FIELD OF INVENTION

The present invention broadly relates to a photoelectrochemical cell for wastewater treatment and a method of fabricating such a photoelectrochemical cell.

BACKGROUND

Many countries may be densely populated with limited freshwater resources. One example being Singapore, which may be one of the most water-stressed country in the world. In order to meet the total water demand, the country has been investing heavily in advanced water treatment technologies, leading to revolutionary practices, such as water reuse, which provides about 30% of the country's water demand.

However, as such countries continue to develop their economy, their industrial sector grows rapidly and produces hard-to-degrade organic chemicals, which tend to be harmful to humans and the environment. Such chemicals are neither easily nor effectively removed by conventional water reclamation plants.

From a water security perspective, there is also a risk that some of these harmful and recalcitrant compounds may end up in freshwater reservoirs. Moreover, in an urban environment such as Singapore, which faces intense demographic pressure, additional risks of undesirable algal blooms, development of antibiotic resistance, accidental contamination (e.g. waterborne disease outbreaks, accidental or terrorist chemical spills) etc. are prone to emerge. It is therefore essential to safeguard water quality and public health.

In particular, one of the more prominent growing concerns may be the release of hazardous persistent organic pollutants (POPs) into the environment. These POPs can be detected even at low amounts in rivers, lakes, oceans, and even drinking water all over the world. As these pollutants cannot be significantly removed by conventional wastewater treatment plants, interest has been developing on total removal of POPs with a focus on exploring simple, safe, effective, and economical physico-chemical technologies. While developing such technologies, consideration has also been taken to reduce the environmental footprint of water treatment processes of POPs. In this regard, the use of renewable energy such as sunlight in physico-chemical treatment processes of POPs has been explored.

Amongst the various physico-chemical treatment processes that rely on the use of sunlight (i.e. ultraviolet (UV) reactivity), photon based advanced oxidation processes (AOPs) have gained popularity because they allow the generation of hydroxyl radical ($^\bullet OH$), a very strong oxidizing agent ($E°=2.80$ V versus (v) standard hydrogen electrode (SHE)) which is second only to fluorine but less hazardous. $^\bullet OH$ has a very short lifetime of $10^{-9}$ seconds and its non-selectivity allows it to oxidize many biorefractory organic compounds, especially those with double bonds, very quickly. An example of a photon based AOP is ozone photolysis ($O_3$/UV).

However, ozone photolysis and other ozone based AOPS tend to be very energy consuming due to the low water solubility of $O_3$. In addition, Fenton's process generates sludge in quantities which require increased means of handling or disposal. Furthermore, ozone photolysis and other conventional photon based AOPs suffer from several other drawbacks, one of which is the high usage of chemical reagents, especially $H_2O_2$ which has a relatively weak molar absorption coefficient in the UV region and thus reduces the efficiency of UV irradiation in the presence of $H_2O_2$. Another drawback of photon based AOPs (e.g. photocatalytic oxidation) is the recovery of photocatalyst(s). With these drawbacks, scaling up such treatment processes becomes undesirably arduous.

There is thus a need to provide for a solution that ameliorates one or more of the drawbacks as mentioned above. The solution provided should be suitable for treating water and/or wastewater.

SUMMARY

In accordance with one aspect of the present invention, there is a photoelectrochemical cell for wastewater treatment comprising at least one cathode and at least one anode, wherein the anode comprises a material configured for an anodic oxidation reaction in the presence of the wastewater, wherein at least one of the anode and cathode comprises an optically pervious material, the cathode configured for cooperating with the anode to drive one or more cathodic reduction reactions in the presence of the wastewater, and wherein the anode and the cathode are disposed to allow irradiation of at least a portion of a space between the anode and the cathode by a light source through the optically pervious material to activate at least one photon based reaction in the wastewater.

In accordance with another aspect of the present invention, there is a method of fabricating a photoelectrochemical cell, the method comprising providing at least one cathode and at least one anode, wherein the anode comprises a material configured for an anodic oxidation in the presence of the wastewater, wherein at least one of the anode and cathode comprises an optically pervious material, configuring the cathode for cooperating with the anode to drive one or more cathodic reduction reactions in the presence of the wastewater, and configuring the anode and the cathode to allow irradiation of at least a portion of a space between the anode and the cathode by a light source through the optically pervious material to activate at least one photon based reaction in the wastewater.

BRIEF DESCRIPTION OF THE DRAWINGS

In the drawings, like reference characters generally refer to like parts throughout the different views. The drawings are not necessarily to scale, emphasis instead generally being placed upon illustrating the principles of the invention. In the following description, various embodiments of the present disclosure are described with reference to the following drawings, in which.

DETAILED DESCRIPTION

Figure 1A:
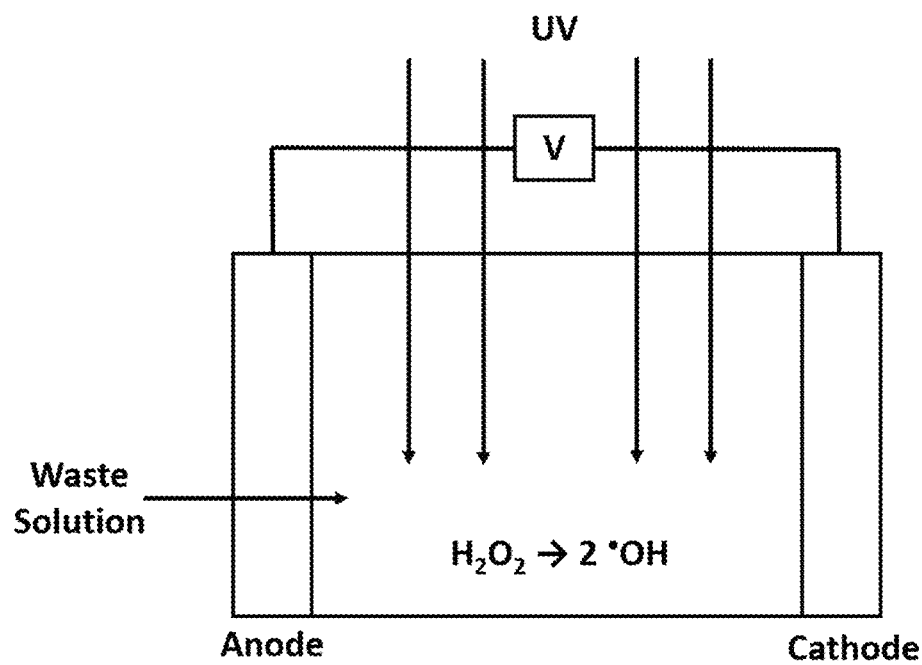
FIG. 1A illustrates the design of a conventional reactor where light does not shine perpendicularly through the anode and cathode but is directed from the top of the setup.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and changes may be made without departing from the scope of the invention. The various embodiments are not necessarily mutually exclusive, as some embodiments can be combined with one or more other embodiments to form new embodiments.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

To address the drawbacks associated with conventional ozone treatments and AOPs as discussed above, one of the ways is to replace the chemicals used with a clean reagent (electrons) that enhances removal efficiency. Such processes may be known as electrochemical advanced oxidation processes (EAOPs), which are based on continuous electrochemical generation of ˙OH. Unlike conventional AOPs as described above, EAOPs tend to be more flexible and cover a broad range of organic loads.

Photo-electro-Fenton (PEF) is one of such EAOPs. In contrast with conventional Fenton's process, the Fenton's reagent ($H_2O_2$ and/or Fe$^{2+}$) is generated electrocatalytically and in situ at the cathode of a PEF reactor and produces ˙OH by equation 1 below. Meanwhile, the UV irradiation of Fe(III) hydroxy complexes (Fe(OH)$^{2+}$), the preponderant Fe(III) species at pH around 3 formed from equation 2a, brings another source of ˙OH as shown in equation 2b below.

$$H_2O_2 + Fe^{2+} \rightarrow Fe^{3+} + \text{˙OH} + HO^- \quad (1)$$

$$H_2O + Fe^{3+} \leftrightarrow Fe(OH)^{2+} + H^+ \quad (2a)$$

$$Fe(OH)^{2+} + h\nu \rightarrow Fe^{2+} + \text{˙OH} \quad (2b)$$

The mineralization of pollutants may be enhanced by UV artificial light or sunlight (having a wavelength (λ) more 300 nm) irradiation, not only by the contribution of ˙OH induced by equation 2b, but also by the rapid photolysis of complexes of Fe(III) (e.g. Fe(OOCR)$^{2+}$) with carboxylic acids (OOCR) (mainly oxalic acid) produced during degradation of organic contaminants, as shown in equation 3:

$$Fe(OOCR)^{2+} + h\nu \rightarrow 2Fe^{2+} + CO_2 + R^{\bullet} \quad (3)$$

In equation 3, R may be an alkyl group. Equation 3 may proceed regardless of the number of carbon atoms present in the alkyl group. Oxalic acid may be one of the most common short chain carboxylic acid quantified during the organic degradation process. In this regard, R may contain 2 carbon atoms. However, R is not limited to 2 carbon atoms.

Other advantages of PEF include the electrochemical regeneration of $Fe^{2+}$ (equation 4). This means that iron can be provided at catalytic amounts if they are not naturally present in the wastewater, thereby avoiding the production of large amounts of sludge.

$$Fe^{3+} + e^- \rightarrow Fe^{2+} \quad (4)$$

In EAOPs, one of the factors that affects treatment efficiency may be the electrode material, and most of the time, opaque electrodes are conventionally employed. In EAOPs, the cathode responsible for in situ generation of $H_2O_2$ through the $O_2$ reduction reaction (ORR) at its surface (equation 5) is typically made of carbon due to its high $H_2$ evolution overpotential and low catalytic activity for $H_2O_2$ decomposition.

$$O_2 + 2H^+ + 2e^- \rightarrow H_2O_2 \quad (5)$$

In this regard, 3D carbon-based electrodes such as graphite felt and carbon felt are usually used because of their high specific surface areas and efficient cathodic regeneration of $Fe^{2+}$ (see equation 4).

Meanwhile, anode materials having high $O_2$ evolution overpotential, referred to as non-active anodes (M), can also play an important role in the oxidation of pollutants through water discharge at their surface, producing weakly-adsorbed $^{\bullet}OH$ as shown in equations 6a and 6b:

$$M(\ ) + H_2O \rightarrow M(^{\bullet}OH) + H^+ + e^- \quad (6a)$$

$$M(^{\bullet}OH) + \text{organic compound} \rightarrow M(\ ) + \text{oxidation products} \quad (6b)$$

In this regard, one of the most popular non-active anodes may be boron-doped diamond (BDD) which allows organics to be oxidized by BDD($^{\bullet}OH$) formed from anodic oxidation (AO).

The combination of AO (equations 6a and 6b) and PEF processes (equations 1, 2a and 2b) therefore advantageously provides three sources of $^{\bullet}OH$.

The solution can also include a further (i.e. fourth) source of $^{\bullet}OH$ in such electrolytic processes. This may consist of $H_2O_2$ electro-activation (EA) through an electron transfer reaction at the carbonaceous cathode, as shown in equation 7:

$$H_2O_2 + e^- \rightarrow {}^{\bullet}OH + HO^- \quad (7)$$

Another way to generate $^{\bullet}OH$ may be to include the use of photocatalyst in such EAOPs. Amongst the different semiconductors tested for photocatalysis (PC), titanium dioxide ($TiO_2$) in its crystallized anatase form gave the best performance. When $TiO_2$ is irradiated by UV light of wavelength below 380 nm, an electron from the filled valence band is promoted to the empty conduction band ($e_{cb}^-$) with an energy gap of 3.2 eV generating a positively charged vacancy, referred to as a hole ($h_{vb}^+$). This is depicted by equation 8. The holes produced at the $TiO_2$ surface can oxidize either water or $OH^-$, thus generating $^{\bullet}OH$ as shown in equations 9 and 10, respectively.

$$TiO_2 + h\nu \rightarrow e_{cb}^- + h_{vb}^+ \quad (8)$$

$$h_{vb}^+ + H_2O \rightarrow {}^{\bullet}OH + H^+ \quad (9)$$

$$h_{vb}^+ + OH^- \rightarrow {}^{\bullet}OH + H^+ \quad (10)$$

$TiO_2$ presents the additional benefit of being potentially immobilized as a coating on a conductive material such as titanium, so that it could be employed as an anode in the so-called photo-electrocatalytic process (PEC). PEC was shown to increase the mineralization efficiency of PC by decreasing the charge recombination from equation 11:

$$e_{cb}^- + h_{vb}^+ \rightarrow TiO_2 + \text{heat} \quad (11)$$

The coupling of PC and PEC with PEF improves the oxidation ability over treatments such as PEF/PC and PEF/PEC, wherein both only involved three sources of $^{\bullet}OH$ (see equations 1, 2, 9 and 10). The PEF/PC and PEF/PEC combinations increase the accumulation of $H_2O_2$ in the bulk solution through, respectively, photocatalytic generation of $H_2O_2$ (equation 12) and oxygen reduction reaction(s) (ORR) at the carbon cathode via the transfer of photo-generated electrons ($e_{cb}^-$) from the photo-anode (equation 13, also known as photo-AO, (PAO)):

$$2H_2O + 2h_{vb}^+ \rightarrow H_2O_2 + 2H^+ \quad (12)$$

$$O_2 + 2H^+ + e_{cb}^- \rightarrow H_2O_2 \quad (13)$$

These reactions provide additional $H_2O_2$ precursors for the Fenton reaction (equation 1) to form $^{\bullet}OH$.

With the aim of further improving the efficiency of oxidation, PEF/PAO/PC combination as well as PEF/PAO/PEC have been explored. These combinations involve four sources of $^{\bullet}OH$ (see equations 1, 2, 6a, 6b, 9 and 10). In the latter combination, solar driven transparent electrode made of $Bi_2WO_6$ photocatalyst deposited on a fluorine-tin oxide (FTO) glass photo-anode may be employed in a semi-cylindrical quartz reactor. This apparatus enhances the quantum yield by optimizing the contact of photons with $Bi_2WO_6$. More importantly, the AO mechanisms (equations 6a and 6b) on the FTO anode, the $H_2O_2$ electro-activation (equation 7) and the $H_2O_2$ photolysis (equation 14) that could potentially occur during the treatment of organic pollutants remain conventionally elusive.

$$H_2O_2 + h\nu \rightarrow 2^{\bullet}OH \quad (14)$$

By minimizing the inter-electrode distance and by using a transparent glass anode as a wall of the device, the $H_2O_2$ photolysis (equation 14) could be implemented. In order to conceive such complex reactor design, 3D printing technology, also known as additive manufacturing or rapid prototyping, may be employed. Compared to traditional manufacturing technologies, the main advantage of 3D printing is the ability to fabricate intricate design and produce an assembly in a single-step process while reducing manufacturing cost and material wastes. There are many applications of 3D printing technology in a variety of industries, for instance, aerospace, biomedical, building and construction, marine and offshore, food industry, as well as desalination with membrane and water treatment fuel cell and microbial fuel cell. The benefit of utilizing 3D printing for EAOPs application is demonstrated in the present disclosure accordingly.

With the above in mind, the present disclosure describes the implementation of six sources of $^{\bullet}OH$ (mechanisms are shown in equations 1, 2, 6a, 6b, 7, 9 and 10 and 14) via the combination of EA, PAO, PEF and PC/PEC processes. A 3D porous carbon felt cathode and a fluorine-doped tin oxide (FTO) transparent anode may be employed in two kinds of reactor design: (i) a stirred glass photo-reactor and (ii) a 3D-printed flow-cell photo-reactor. The present disclosure also describes comprehensive characterization of the electrochemical and transmissivity properties of FTO, optimization of the $TiO_2$ coating efficiency on glass substrate, assessment of the performance of photo-electro-catalytic Fenton in a stirred glass reactor, and evaluation and comparison with a 3D-printed flow cell.

Before going into further details of the photoelectrochemical reactor and its method of making, the definitions of certain terms are first discussed.

The terms "hydroxyl" and "hydroxy" may be interchangeably used to refer to an entity with the formula OH in the present disclosure.

In the context of the present application, the phrase "optically pervious" refers to materials that allow light to pass. This would cover materials that may be transparent or translucent but not opaque.

The word "substantially" does not exclude "completely" e.g. a composition which is "substantially free" from Y may be completely free from Y. Where necessary, the word "substantially" may be omitted from the definition of the invention.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As used herein, the phrase of the form of "at least one of A and B" may include A or B or both A and B. Correspondingly, the phrase of the form of "at least one of A and B and C", or including further listed items, may include any and all combinations of one or more of the associated listed items.

Unless specified otherwise, the terms "comprising" and "comprise", and grammatical variants thereof, are intended to represent "open" or "inclusive" language such that they include recited elements but also permit inclusion of additional, unrecited elements. Meanwhile, the terms "consisting" and "consist", and grammatical variants thereof, are intended to represent "close" or "exclusive" language such that they only include recited elements but do not permit inclusion of additional, unrecited elements.

Having defined the various terms, details of the various embodiments are now described below. Embodiments described in the context of the photoelectrochemical cell are analogously valid for the method of fabricating such a photoelectrochemical cell, and vice versa.

The present disclosure provides a photoelectrochemical cell for wastewater treatment comprising at least one cathode and at least one anode. The anode may comprise a material configured for an anodic oxidation reaction in the presence of the wastewater. At least one of the anode and cathode may comprise an optically pervious material according to various embodiments. The cathode may be configured for cooperating with the anode to drive one or more cathodic reduction reactions in the presence of the wastewater. The anode and the cathode may be disposed to allow irradiation of at least a portion of a space between the anode and the cathode by a light source through the optically pervious material to activate at least one photon based reaction in the wastewater.

In various embodiments, the photoelectrochemical cell may consist of a cathode and an anode. Both the cathode and anode may be independently optically pervious or opaque. The cathode may possess a hydrogen evolution overpotential below −0.6 V/SHE (i.e. standard hydrogen electrode). This range of overpotential improves production of hydrogen peroxide and in turn the ˙OH. The cathode may be made from any carbon based materials or platinum or a combination of these materials. In various embodiments, the cathode may be made of a material selected from the group consisting of carbon/graphite felt, carbon fiber brush, carbon cloth, boron-doped diamond (BDD), graphene, 3D porous carbon/graphite felt, and their combinations thereof.

As for the anode, it may be configured to comprise the optically pervious material coated with the material for anodic oxidation. The optically pervious material may act as a support or substrate for the anodic oxidation material. The latter may be a conducting film. The material configured for anodic oxidation (and thus the anode) may be selected from the group consisting of fluorine-doped tin oxide (FTO), indium tin oxide (ITO), boron-doped diamond (BDD), tin oxide ($SnO_2$), lead oxide ($PbO_2$), sub-stoichiometric titanium oxide (e.g. $Ti_4O_7$) and combinations thereof. These materials may allow light to pass through partially or entirely. In various embodiments, the anode may also possess an oxygen evolution potential of at least 1.5 V/SHE, or preferably at least 1.9 V/SHE, which leads to production of ˙OH.

The wastewater or water treated by the photoelectrochemical cell optionally comprises $Fe^{2+}$, $Fe^{3+}$ and/or ferric hydroxyl complexes. When these substances are present in the wastewater/water, Fenton's reaction and photolysis of ferric complexes can then proceed and these accounts for two ˙OH sources. If the wastewater/water does not contain such iron constituents, then these substances may be added in manually. The present photoelectrochemical cell is thus versatile in that it can process various types of water and wastewater while providing multiple sources of hydroxyl radicals.

As mentioned above, the anode and/or cathode may comprise the optically pervious material. The optically pervious material may be transparent or translucent as long as it allows light to pass through sufficient to activate light dependent reactions or photon based reactions for water and wastewater treatment. Transparent materials may include glass etc. while translucent materials may include sandblasted glass, amber glass, quartz etc. The optically previous material may comprise glass or quartz according to various embodiments disclosed herein.

Apart from anodic oxidation, one or more cathodic reduction reactions may occur in the photoelectrochemical cell. The one or more cathodic reduction reactions may comprise reduction of oxygen, reduction of $Fe^{3+}$ and/or electro-activation of hydrogen peroxide.

Having discussed the materials used for the anode and cathode, the configuration of the photoelectrochemical cell is now described. In the photoelectrochemical cell, the anode and the cathode may be disposed to face each other while remaining spaced apart by a distance of about 10 mm to about 30 mm or a distance of less than about 10 mm. In various embodiments, the anode and cathode may be kept apart at any distance (e.g. about 30 mm or less) as long as the provision of multiple sources of ·OH is not hindered. Advantageously, this reduces footprint of the photoelectrochemical cell.

The photoelectrochemical cell may further comprise a chamber having a base portion and a wall portion extending from the base portion, wherein the anode and the cathode may be disposed in the chamber. The chamber may be an open chamber in that it may comprise an opening defined by the wall portion. This opening may be arranged opposing to the base portion. In other embodiments, the chamber may be a closed chamber.

In some embodiments, the chamber may be integrally formed with the anode and the cathode defining part of the wall portion of the chamber. For such configuration, the anode and/or cathode may be constructed as the walls of the cell. In other words, the present photoelectrochemical cell may be constructed of a single wall corresponding to the thickness of the anode and/or cathode. This single wall configuration is advantageous compared to double walls where there is a reactor wall in addition to the anode. In the case of double walls, more photons tend to be absorbed before reaching the active surface, photocatalyst and/or at least a portion of the space between the anode and cathode, thereby resulting in lower quantum yield (as photons are lost).

The photoelectrochemical cell may further comprise an inlet and an outlet at the wall portion of the chamber, wherein the inlet and the outlet may be in fluid communication with the chamber and may be disposed at opposing ends of the chamber. With the inlet and outlet, the photoelectrochemical cell may be used as a continuous system instead of a batch system.

In some embodiments, the base portion of the chamber may comprise one or more openings, and when more than one openings are present, the openings may be arranged in order of increasing cross-sectional area with increasing distance from the inlet to the outlet. Advantageously, this arrangement mitigates pressure differences across the chamber. The openings may be distributed evenly across the base portion.

The photoelectrochemical cell may further comprise a photocatalyst disposed on an inner base portion and/or an inner wall portion of the chamber to allow irradiation of at least the portion of the space between the anode and the cathode. The photocatalyst may be disposed as a layer on the anode or the optically pervious material. In various instances, the amount of photocatalyst present may lead to a resultant transmissivity (in UVA region, e.g. 365 nm) of more than 10% and preferably about 20%. Bearing this consideration in mind, the amount of photocatalyst disposed may be about 0.024 mg/cm$^2$ to about 0.4 mg/cm$^2$ in some embodiments, while this may also depend on material of photocatalyst used. In this regard, the photocatalyst may be selected from the group consisting of titanium dioxide ($TiO_2$), zinc oxide (ZnO), zinc tungstate ($ZnWO_4$), bismuth tungstate ($Bi_2WO_6$), and combinations thereof.

The photoelectrochemical cell may further comprise an optical medium configured to increase incident light on the optically pervious material. This optical medium may provide light i.e. either directly or indirectly channeling the light towards the photoelectrochemical cell. The optical medium may be a reflective medium such as a mirror. In some instances, the optical medium may be disposed at the side of the anode to channel light through the anode into the photoelectrochemical cell. The light from the optical medium or a light source may be configured to provide light having a wavelength of 10 nm to 400 nm. The light provided may be any form of ultraviolet light such as UVA, UVB and/or UVC (e.g. 254 nm). In preferred embodiments, UVA light is used.

The photoelectrochemical cell may further comprise an aerator configured to provide oxygen gas to the photoelectrochemical cell, wherein the aerator may be in fluid communication with the one or more openings at the base portion of the chamber. The aerator may also provide other gases to treat water/wastewater.

The photoelectrochemical cell may further comprise a dispensing device configured to dispense an aqueous solution comprising $Fe^{2+}$, $Fe^{3+}$ and/or ferric hydroxyl complexes to the photoelectrochemical cell. This dispensing device may be configured in any manner as long as it is in fluid communication with the photoelectrochemical cell. That is, the aqueous solution may be dispensed into the cell via a conduit. The aqueous solution may also be added to the water/wastewater through the cell's opening (i.e. when the cell is an open chamber).

The photoelectrochemical cell may be capable of generating at least one photon based reaction. The photon based reaction may comprise hydrogen peroxide photolysis, ferric hydroxyl complex photolysis, photocatalysis of water and/or photo-oxidation of $OH^-$.

The photoelectrochemical cell may be in the form of a stirred glass reactor or a 3D printed reactor according to non-limiting exemplary embodiments.

There is also a method of fabricating the photoelectrochemical cell in the present disclosure. The method may comprise providing at least one cathode and at least one anode, wherein the anode may comprise a material configured for an anodic oxidation in the presence of the wastewater, wherein at least one of the anode and cathode may comprise an optically pervious material. The method may also include configuring the cathode for cooperating with the anode to drive one or more cathodic reduction reactions in the presence of the wastewater, and disposing the anode and the cathode to allow irradiation of at least a portion of a space between the anode and the cathode by a light source through the optically pervious material to activate at least one photon based reaction in the wastewater.

The embodiments and their advantages as described above in relation to the photoelectrochemical cell are applicable to the present method.

In the present method, the disposing of the anode and the cathode may comprise arranging the anode and the cathode to face each other in the photoelectrochemical cell while remaining spaced apart by a distance of about 30 mm or less, about 10 mm to about 30 mm or a distance of less than about 10 mm, according to various embodiments.

The arranging of the anode and the cathode may comprise providing a chamber having a base portion and a wall portion extending from the base portion, and disposing the anode and the cathode in the chamber. The chamber may be an open or close chamber as described above.

The providing of the chamber having a base portion and a wall portion extending from the base portion may comprise integrally forming the chamber with the anode and the cathode defining part of the wall portion of the chamber. In this manner, a single wall chamber with the anode and/or cathode incorporated as part of the wall may be provided.

In various embodiments, the providing of the chamber may comprise integrally forming the chamber by 3D printing. The providing of the chamber may also comprise forming an inlet and an outlet at the wall portion of the chamber, wherein the inlet and the outlet may be in fluid communication with the chamber and may be disposed at opposing ends of the chamber. Providing an inlet and outlet advantageously configures the cell into a continuous system.

In the present method, the providing of the chamber may comprise forming one or more openings in the base portion, and wherein forming more than one openings may comprise forming the openings in order of increasing cross-sectional area with increasing distance from the inlet to the outlet. The openings may be evenly distributed.

The present method may further comprise a step of disposing a photocatalyst on an inner base portion and/or an inner wall portion of the chamber to allow irradiation of at least the portion of the space between the anode and the cathode. The disposition of the photocatalyst may comprise disposing the photocatalyst as a layer on the anode or optically pervious material. The consideration on the amount of photocatalyst for disposition has been discussed above.

The present method may further comprise providing an optical medium configured to increase incident light on the optically pervious material. The optical medium has been described in the above embodiments. A light source may also be provided.

The present method may further comprise providing an aerator configured to provide oxygen gas to the photoelectrochemical cell, wherein providing the aerator may comprise disposing the aerator to be in fluid communication with the one or more openings at the base portion of the chamber. Other gases may be provided by through the aerator.

The present method may further comprise providing a dispensing device configured to dispense an aqueous solution comprising $Fe^{2+}$, $Fe^{3+}$ and/or ferric hydroxyl complexes to the photoelectrochemical cell.

In summary, the technology as disclosed herein relates to a reactor suitable for water and wastewater treatment with multiple sources of production of hydroxyl radicals. The reactor may be a photo-electrocatalytic reactor. The production sources of hydroxyl radicals may comprise at least two of the processes selected from anodic oxidation, hydrogen peroxide photolysis, ferric-hydroxy complex photolysis, Fenton's reaction, photocatalysis, or their combination thereof.

In various embodiments, the anode and/or cathode may be opaque, translucent or transparent.

A process for water and wastewater treatment comprising such a reactor with multiple sources of production of hydroxyl radicals is contemplated.

While the methods described above are illustrated and described as a series of steps or events, it will be appreciated that any ordering of such steps or events are not to be interpreted in a limiting sense. For example, some steps may occur in different orders and/or concurrently with other steps or events apart from those illustrated and/or described herein. In addition, not all illustrated steps may be required to implement one or more aspects or embodiments described herein. Also, one or more of the steps depicted herein may be carried out in one or more separate acts and/or phases.

EXAMPLES

Figure 13:
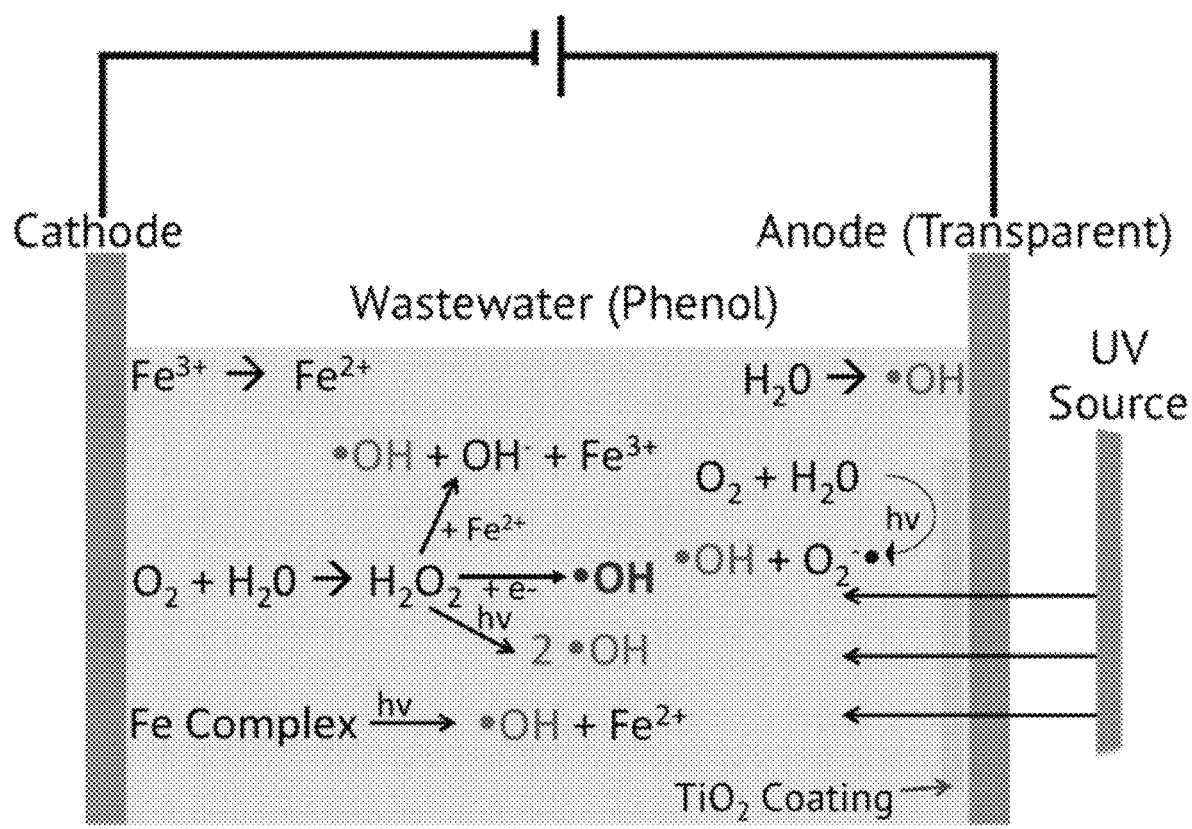
FIG. 13 shows the various hydroxyl radical pathways (6 different souces).

The present disclosure relates to a solution that resolves the drawbacks as described above. The solution involves a photo-electrocatalytic or photoelectrochemical reactor that provides multiple sources of hydroxyl ($^\cdot$OH) radicals for advanced water and wastewater treatment (see FIG. 13). The expression "photo-electrocatalytic" may be used interchangeably with "photoelectrochemical" in the present disclosure. Such a reactor may be called a cell in the present disclosure. With a reactor configured to provide multiple sources of $^\cdot$OH, the multiple sources of $^\cdot$OH combine to produce a synergetic effect that enhances treatment efficiency of water and wastewater.

The reactor may be designed to have two electrodes. Without being limited to the following materials, the first electrode may be a high oxygen evolution overpotential anode coated with an additional layer of photocatalyst(s). The anode may have an oxygen evolution overpotential of at least 1.5 V/SHE, or preferably at least 1.9 V/SHE. The anode may comprise a material composed of fluorine-doped tin oxide (FTO), indium tin oxide (ITO), boron-doped diamond (BDD), tin oxide ($SnO_2$), lead oxide ($PbO_2$), sub-stoichiometric titanium oxide (e.g. $Ti_4O_7$) and/or their combinations thereof. The photocatalyst(s) may comprise titanium dioxide ($TiO_2$), $ZnWO_4$, ZnO, $Bi_2WO_6$ and/or their combination thereof. The other electrode may be a cathode made of carbon fiber brush, carbon cloth, carbon/graphite felt, boron-doped diamond (BDD), platinum, graphene, 3D porous carbon/graphite felt and/or their combination thereof. The cathode may have a $H_2$ evolution overpotential below −0.6 V/SHE. Both the anode and cathode may be independently opaque, transparent or translucent. Both electrodes may be separated by a suitable distance between them.

The present solution also comprises a method of fabricating such a reactor or cell. The method is advantageous because the reactor or cell may be produced as a single piece, such as via 3D printing, to avoid leakages. Aeration within the reactor or cell can be enhanced by including diffusion holes at the bottom.

Advantageously, the method of making such a reactor and the reactor itself, allow water or wastewater to be effectively treated based on a combination of electrochemical processes involving hydroxyl radicals ($^\cdot$OH) produced by the anode and/or cathode, and the use of artificial light or sunlight (e.g. UVA) to promote photocatalytic reactions through the optically pervious (transparent or translucent) anode (see FIG. 1B) as compared to conventional reactors (see FIG. 1A).

Figure 1B:
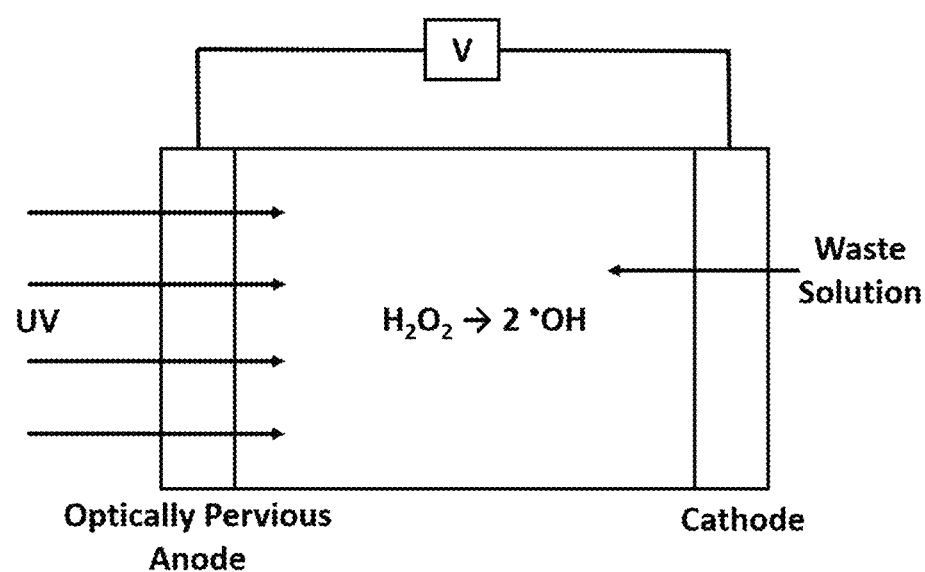
FIG. 1B illustrates a reactor design according to the embodiments disclosed herein where light (e.g. UVA light) goes through the optically pervious anode.
Figure 1D:
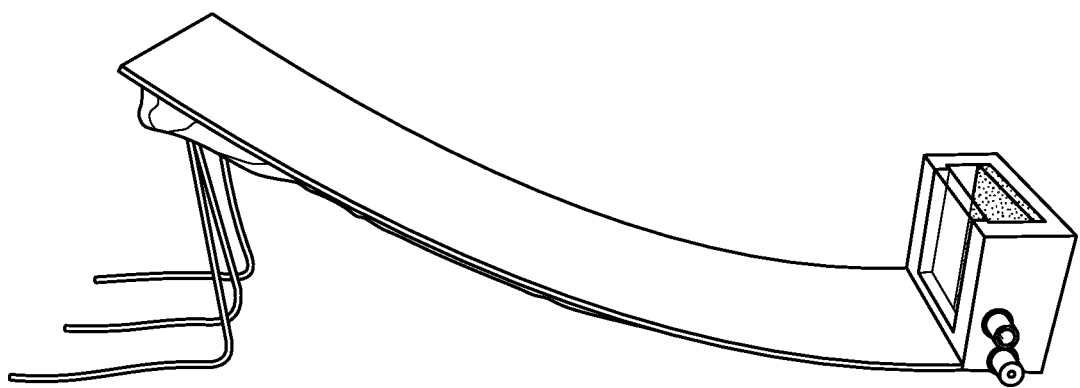
FIG. 1D illustrates a reactor-parabolic reflector system for focusing the UVA light toward the reactor, particularly through the transparent anode.
Figure 2A:
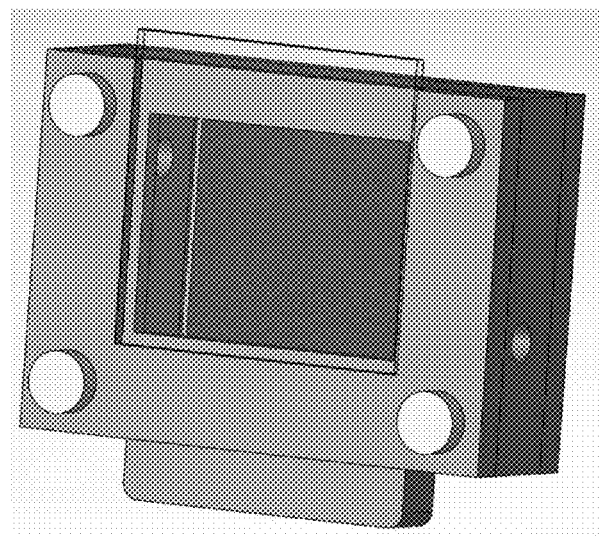
FIG. 2A shows the design of a three dimensional (3D) printed photo-electrocatalytic reactor made according to the embodiments disclosed herein. Specifically, the reactor is a closed cell reactor with $O_2$ bubbling in a separate tank (the separate tank is not shown). This may be referred to as reactor (1) in the present disclosure.
Figure 2B:
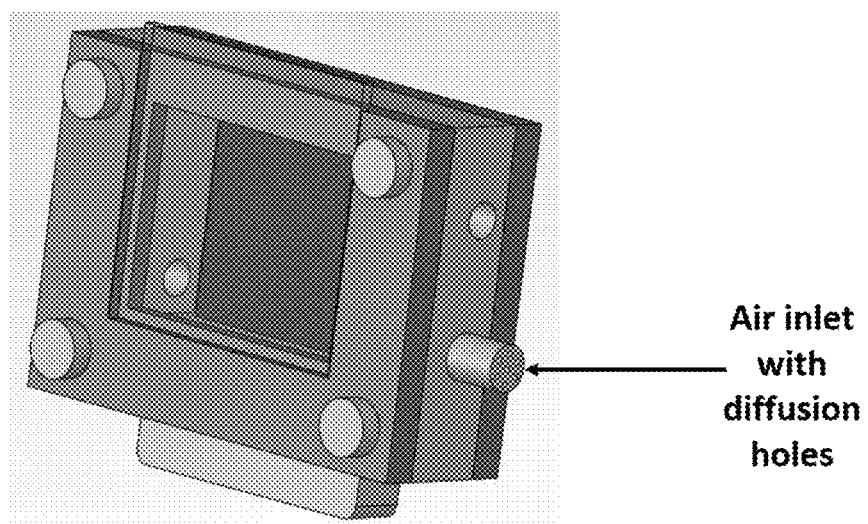
FIG. 2B shows the design of a 3D printed photo-electrocatalytic reactor made according to the embodiments disclosed herein. Specifically, this reactor allowed $O_2$ bubbling directly within the reactor. This may be referred to as reactor (2) in the present disclosure.
Figure 2C:
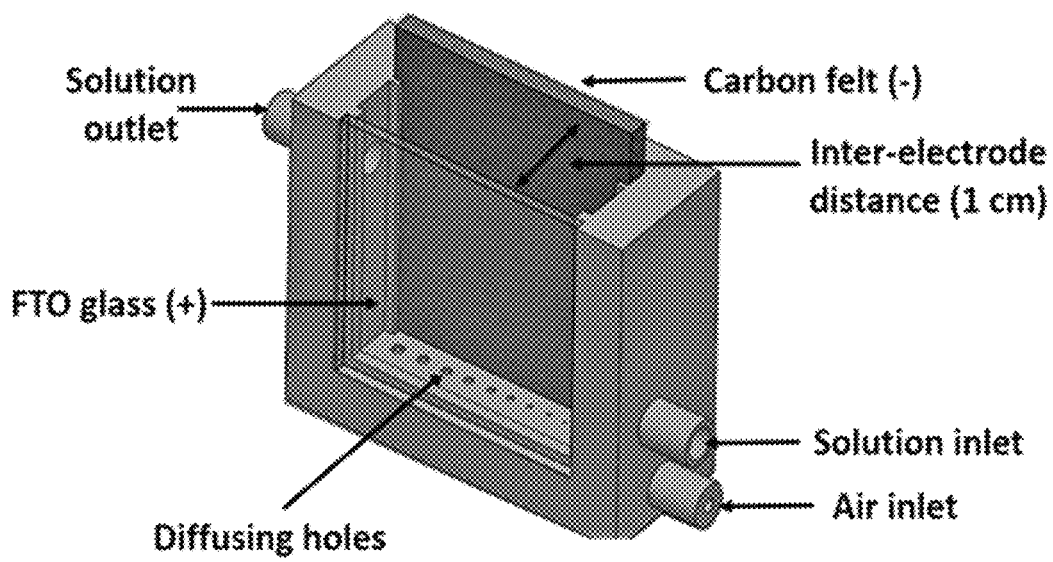
FIG. 2C shows the design of a 3D printed photo-electrocatalytic reactor made according to the embodiments disclosed herein. Specifically, this reactor is an open cell reactor with $O_2$ bubbling in the reactor. This may be referred to as reactor (3) in the present disclosure.

An embodiment of the overall design of reactor is shown in FIG. 2C with the UV light going through the anode as illustrated in FIG. 1B. As an option, a parabolic mirror (see FIG. 1D) can focus the light into the reactor, so that natural sunlight can be harnessed for the photolytic processes.

Compared to conventional reactors or a control with just fluorine-doped tin oxide (FTO) coated on glass, the present cell may comprise a transparent electrode made of glass coated with a transparent film of FTO or indium tin oxide (ITO) and a transparent film of titanium dioxide ($TiO_2$). This exemplary configuration improves mineralization efficiency by at least 15%. In fact, this can improve the mineralization rate (or degradation rate constant) by one order of magnitude. In various instances, the mineralization efficiency increased by 60% or even 400% with 5 or 6 sources of $^\cdot$OH, respectively, when compared to cells that are configured to produce only one source of $^\cdot$OH. Briefly, these sources of $^\cdot$OH include anodic oxidation ($H_2O \rightarrow ^\cdot OH + H^+ + e^-$), hydrogen peroxide photolysis ($H_2O_2 + h\nu \rightarrow 2 ^\cdot OH$), ferric hydroxyl complex photolysis ($[Fe(OH)^{2+}] + h\nu \rightarrow Fe^{2+} + ^\cdot OH$), Fenton's reaction ($Fe^{2+} + H_2O_2 \rightarrow Fe^{3+} + OH^- + ^\cdot OH$), heterogenous photocatalysis (photocatalyst (e.g. $TiO_2$) + $h\nu + H_2O_2 \rightarrow H^+ + ^\cdot OH + ^\cdot O_2^-$), and electro-activation of hydrogen peroxide ($H_2O_2 + e^- \rightarrow ^\cdot OH + HO^-$). The details of these reactions have been described above.

Examples 1 to 6 relate to the experimental materials and methods while examples 7 to 15 relate to the results and discussion of the experiments.

Example 1: Lists of Chemicals Used $TiCl_4$ (99.9%), phenol (>99%), acetic acid (>99%), $TiO_2$ (Degussa P25) (>99.5%), Triton X-100 and $H_2O_2$ (30% v/v) were purchased from Sigma-Aldrich (Singapore). Potassium sulfate (99%) was provided by Nacalai Tesque (Singapore). $FeSO_4 \cdot 7H_2O$ (>99%) was supplied by Merck (Singapore) and methanol (99.9%) by Fisher Scientific (Singapore). All the chemicals were of analytical grade and were used as is. All the solutions were prepared with ultrapure water (Milli-Q® Advantage A10, Singapore) giving a resistivity higher than 18 MS2 cm at room temperature.

Example 2: Assessment of Fluorine-Doped Tin Oxide (FTO) Characteristics

The oxidation characteristics of FTO (Latech, Singapore), such as its $O_2$ evolution overvoltage was assessed by linear scanning voltammetry (LSV) with a potentiostat (Princeton Applied Research VersaSTAT 4, USA) in a three-electrode set-up, using glass coated on one side with FTO (15 $cm^2$) as a working electrode, platinum (Pt, 30 $cm^2$) as a counter electrode, and Ag/AgCl ($KCl_3$ M) (E=0.210 V vs SHE) as a reference electrode. The experiments were conducted in a 0.5 M solution of $H_2SO_4$ at a voltage ranging from 0.5 to 3.0 V vs SHE and at a scan rate of 20 mV $s^{-1}$.

The transmittance of FTO was assessed by performing a scan of wavelength ranging from 200 nm to 435 nm using a DR 5000 (HACH, USA) spectrophotometer.

Example 3: Preparation and Assessment of $TiO_2$ Deposited on Glass—Preparation of $TiO_2$ Thin Film The $TiO_2$ particles were coated as a thin film onto different surfaces. Prior to coating, each surface was cleaned thoroughly with ethanol. $TiO_2$ was coated on either FTO glass (Latech, Singapore) or on the inner wall of a 250 ml cylindrical glass reactor, yielding a coated area of 15 $cm^2$ and 92 $cm^2$, respectively.

A diluted acetic acid solution was prepared by adding 0.3 ml of concentrated acetic acid to 100 ml of ultrapure water. A specific amount of $TiO_2$ was then grounded in a mortar with 2 ml of the diluted acetic acid solution. The remaining 100 ml of diluted acetic acid solution was slowly added to the mixture with constant grinding. Finally, 0.5 ml of Triton X-100 surfactant was added and mixed thoroughly. 1 ml of the $TiO_2$ suspension was spread evenly onto the surface of the substrate. For the FTO glass, the mixture was allowed to sit for 10 minutes (mins), while for the curved glass surface, the coating mixture was constantly rotated for 10 mins. After removing the excess mixture, the coating was air dried and then heated for 30 mins at 500° C. in an oven. Finally, the mass concentration of $TiO_2$ in mg $cm^{-2}$ was determined by weighing the substrate before and after the coating procedure.

Example 4: Preparation and Assessment of $TiO_2$ Deposited on Glass—Coating Efficiency as a Function of $TiO_2$ Concentration To ascertain the optimal concentration of $TiO_2$ for degrading and mineralizing a synthetic wastewater stream, a series of experiments were conducted using different concentrations of $TiO_2$, i.e. 1, 2, 4, 6, 8, 10, 11, 12, 13 and 14 g, each of these corresponding to the respective following yields i.e. 0.023, 0.045, 0.096, 0.125, 0.173, 0.243, 0.269, 0.298, 0.311 and 0.345 mg $cm^{-2}$ (in terms of $TiO_2$ mass concentration).

The decrease of transmissivity to UV irradiation caused by the coating of $TiO_2$ onto the glass wall was measured with a spectrophotometer (DR 5000, Hach, USA) before and after coating over the range of UV wavelength from 200 nm to 400 nm.

The photocatalytic response of $TiO_2$ was evaluated under the irradiation from a UV lamp (UVP, UVGL-58 Handheld UV Lamp, 365 nm, 6 W) applied 1 cm away from the side of the glass wall coated with $TiO_2$. A 250 ml $TiO_2$ coated cylindrical glass was filled with 200 ml of 0.01 mM methylene blue (MB), which was used as a substitute dye pollutant with easy degradation monitoring through absorbance measurements. Oxygen gas was bubbled into the medium at a rate of 0.2 litre $min^{-1}$ using a gas diffuser. A magnetic stirrer was used to ensure the homogeneity of the solution. The absorbance of each sample was measured by spectrophotometry at the peak wavelength of 668 nm.

The stability of the coating was then assessed at optimal $TiO_2$ concentration by six successive photocatalytic batch treatments of 90 mins each. The decay of MB was monitored by spectrophotometry.

Example 5: Assessment of Single and Combined Photo-Electrocatalytic Treatments with Stirred Glass Reactor Electrolysis was performed in a 0.25 litre open undivided cylindrical glass reactor under controlled conditions of current and temperature (28±0.1° C.) (see FIG. 1C). Carbon felt (40 $cm^2$, SGL Group, USA) was used as a cathode to ensure $H_2O_2$ production (see equation 5) while the efficiency of FTO coated glass (15 $cm^2$) was compared to Pt (30 $cm^2$) as anode. The distance between the cathode and the anode was fixed at 3 cm and they were immersed into a 200 ml solution of $K_2SO_4$ (0.05 M) as supporting electrolyte. The solutions were continuously stirred at 500 rpm in batch mode. The initial pH of the solution was adjusted to a value of pH 3 for the Fenton reaction. The air flow rate was set at 0.2 litre $min^{-1}$ for 20 mins before starting the electrolysis and until the end of the experiment in order to stay at saturation to provide a continuous $O_2$ source for $H_2O_2$ production. The electrochemical cell was monitored by a power supply (HAMEG 7042-5, Germany) at constant current density (1.25 mA $cm^{-2}$) as reported based on the cathode surface area used.

The test conditions used with the uncoated glass reactor and the respective type of processes are presented in Table 1 below.

TABLE 1

Experimental Conditions in Cylindrical Glass Reactor Using a Carbon Felt Cathode

| No. | Type of Process* | Anode | Dark/UV | No $Fe^{2+}$/ $Fe^{2+}$ | No $TiO_2$/$TiO_2$ |
|---|---|---|---|---|---|
| 0 | UV | — | UV | No $Fe^{2+}$ | No $TiO_2$ |
| 1 | EO/EA | Pt | Dark | No $Fe^{2+}$ | No $TiO_2$ |
| 2 | EA/AO | FTO | Dark | No $Fe^{2+}$ | No $TiO_2$ |
| 3 | PEO/EA | Pt | UV | No $Fe^{2+}$ | No $TiO_2$ |
| 4 | EA/PAO | FTO | UV | No $Fe^{2+}$ | No $TiO_2$ |
| 5 | EA/EF | Pt | Dark | $Fe^{2+}$ | No $TiO_2$ |
| 6 | EA/EF/AO | FTO | Dark | $Fe^{2+}$ | No $TiO_2$ |
| 7 | EA/PEF | Pt | UV | $Fe^{2+}$ | No $TiO_2$ |

TABLE 1-continued

Experimental Conditions in Cylindrical Glass Reactor Using a Carbon Felt Cathode

| No. | Type of Process* | Anode | Dark/UV | No Fe²⁺/ Fe²⁺ | No TiO₂/TiO₂ |
|---|---|---|---|---|---|
| 8 | EA/PEF/PAO | FTO | UV | Fe²⁺ | No TiO₂ |
| 9 | EA/AO/TiO₂ | FTO | Dark | No Fe²⁺ | TiO₂ on stirred glass reactor |
| 10 | EA/PAO/PC | FTO | UV | No Fe²⁺ | TiO₂ on stirred glass reactor |
| 11 | EA/EF/AO/TiO₂ | FTO | Dark | Fe²⁺ | TiO₂ on stirred glass reactor |
| 12 | EA/PEF/PAO/PC | FTO | UV | Fe²⁺ | TiO₂ on stirred glass reactor |

*EO: electro-oxidation; EA: electro-activation; AO: anodic oxidation; PEO: photo-electro-oxidation; PAO: photo-anodic oxidation; EF: electro-Fenton; PEF: photo-electro-Fenton; PC: photocatalysis.

Four operating parameters were varied in order to better understand the efficiency of the PEF/AO/PC process systematically: (i) dark/UV, (ii) anode material (Pt/FTO), (iii) $Fe^{2+}$ catalyst (without $Fe^{2+}$/with $Fe^{2+}$) and (iv) $TiO_2$ photo-catalyst (without $TiO_2$/with $TiO_2$). The UV lamp was set at 365 nm, which corresponds to UVA, the most abundant UV radiation provided by sunlight. $FeSO_4$ (0.1 mM) was added as a source of $Fe^{2+}$ to implement the Fenton reaction (see equation 1). After determining the desired amount of $TiO_2$ coating on the glass reactor, the optimal concentration of $TiO_2$ was applied.

In each case, the performance was assessed by monitoring phenol mineralization using a TOC-meter (Shimadzu, Japan), where TOC stands for total organic carbon. Phenol (1.4 mM) (TOC=100 mg-C litre⁻¹) was used at this stage because it is a well studied model pollutant that allows comparisons with other AOPs commonly applied for wastewater treatment.

Example 6: Assessment of Single and Combined Photo-Electrocatalytic Treatments with Three Dimensional (3D) Printed Reactors Three 3D printed reactor were developed to test for the degradation and mineralization of phenol, serving as a proof-of-concept for the treatment feasibility of this technology before scaled-up applications are envisaged (see FIG. 2A to FIG. 2C). The reactors were designed with SolidWorks® and made of polylactic acid (PLA) filaments in a 3D printer (Makerbot Replicator 2, USA). Reactor (1) in FIG. 2A consisted of a closed cell with O₂ bubbling in a separate tank, whereas Reactor (2) in FIG. 2B allowed O₂ bubbling directly within the reactor. Reactor (3) in FIG. 2C was an open cell reactor with O₂ bubbling in the reactor.

Figure 1C:
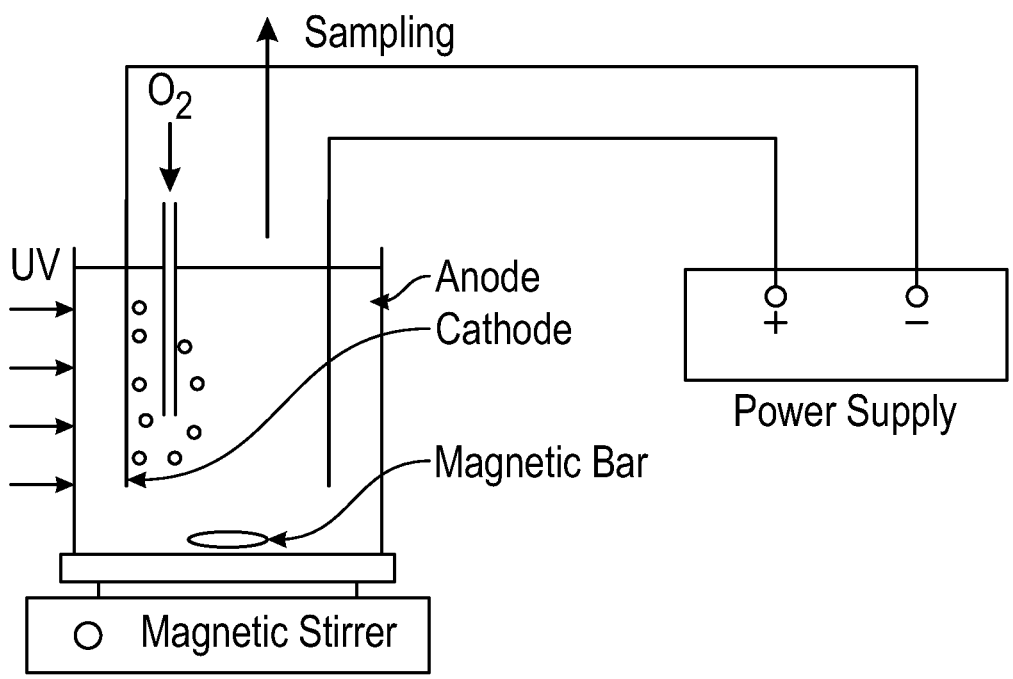
FIG. 1C illustrates an experimental setup of a stirred glass reactor made according to the embodiments disclosed herein.

The desired reactor design should offer several advantages over the stirred glass reactor of FIG. 1C, such as having more effective O₂ diffusion into the cathode and an optimal distance between the electrodes. H₂O₂ decomposition from UV irradiation can also be improved by enhancing the UV irradiation of the medium, since less UV would be lost via scattering through the medium. Also, the use of 3D printing has advantages over constructing a similar flow cell by other techniques, as leakages can be prevented due to the single-body nature of the 3D printed reactor.

The efficiency of the 3D printed reactors was tested with carbon felt cathode (40 cm²) and FTO anode (15 cm²) in the following conditions: (i) dark in absence of $Fe^{2+}$ catalyst (AO), (ii) UV in absence of $Fe^{2+}$ catalyst (PAO), (iii) dark in presence of $Fe^{2+}$ catalyst (EF/AO) and, (iv) UV in presence of $Fe^{2+}$ catalyst (PEF/PAO). The distance between the 2 electrodes was kept at 1 cm in order to minimize UV attenuation through the medium while avoiding the contact of electrodes. When required, the UV lamp was placed directly facing the FTO anode glass at a distance of 1 cm. The same experimental conditions as in the cylindrical glass reactor, i.e. 1.4 mM phenol solution ([$K_2SO_4$]=50 mM; pH=3.0; [$Fe^{2+}$]=0.1 mM when required) and current density of 1.25 mA cm⁻², were selected in recirculated batch mode at a constant flow rate (100 ml min⁻¹) using a peristaltic pump (Cole Parmer, Masterflex L/S). Selection of the best performing reactor relied on monitoring phenol decay with high performance liquid chromatography (HPLC) and UV detector (280 nm) (Shimadzu, Japan). The amount of $H_2O_2$ accumulated in bulk solution was quantified by spectrophotometry (410 nm) and by performing electrolysis experiments in dark conditions and in absence of $Fe^{2+}$ and $TiO_2$.

Once the reactor was selected, the operating conditions were optimized by varying the current density (from 0.62 to 2.5 mA cm⁻²) and the $FeSO_4$ concentration (from 0.05 to 0.2 mM).

Example 7: Results and Discussion—Characteristics of FTO Anode

Figure 3:
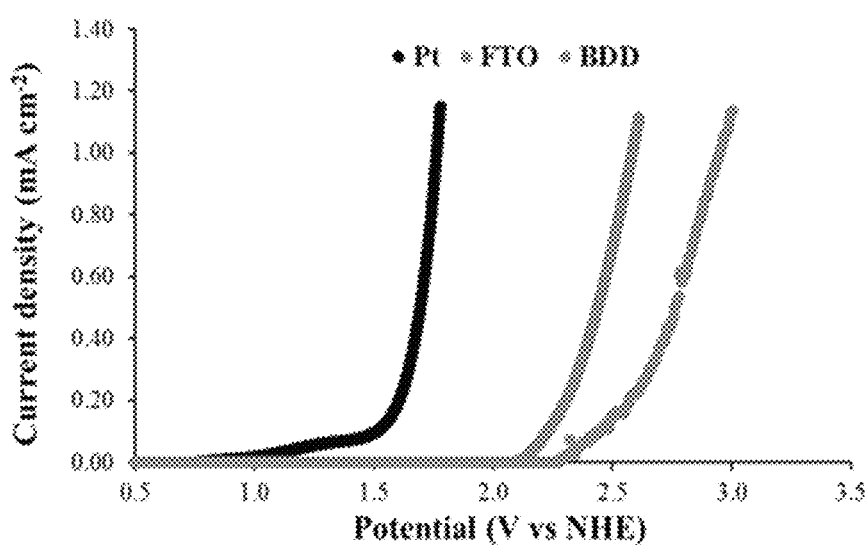
FIG. 3 shows the polarization curves of platinum (Pt), fluorine-doped tin oxide (FTO) and boron-doped diamond (BDD) anodes in 0.5 M $H_2SO_4$ at 20 mV s$^{-1}$.

One of the most important properties of anode material in electrochemical advanced oxidation processes is the ability to produce available ˙OH at its surface. LSV was used to assess this characteristic by determining the oxygen evolution overvoltage from the polarization curves portrayed in FIG. 3. It can be seen that the O₂-overvoltage in 0.5 M $H_2SO_4$ solution equaled 1.6 V vs SHE, 2.1 V vs SHE and 2.3 V vs SHE for Pt, FTO and BDD anodes, respectively. The values observed for Pt and BDD are in agreement with published records. Though a value of 1.9 V vs SHE was previously determined with $SnO_2$ anode, this is unexpectedly obtained for F—$SnO_2$ in the present disclosure. Therefore, the overpotential value for FTO constituted a baseline for future research with such an electrode. Considering the theoretical O₂-overvoltage of 1.23 V vs SHE, the value obtained with Pt showed only a small difference of 0.37 V while more significant differences of 0.87 V and 1.07 V were obtained for FTO and BDD, respectively. For this reason, chemisorbed ˙OH on the Pt anode surface may only result in O₂ production at its surface (see equations 15a and 15b below):

$$Pt(\ )+H_2O \rightarrow Pt(˙OH)+H^++e^- \tag{15a}$$

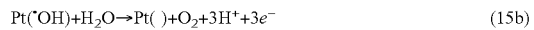
$$Pt(˙OH)+H_2O \rightarrow Pt(\ )+O_2+3H^++3e^- \tag{15b}$$

In contrast, the high overvoltage of FTO allows production of physisorbed ˙OH from water discharge, as already noticed with BDD anode materials, according to equations 16a and 16b below:

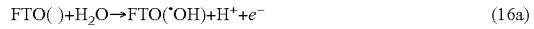
$$FTO(\ )+H_2O \rightarrow FTO(˙OH)+H^++e^- \tag{16a}$$

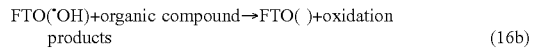
$$FTO(˙OH)+\text{organic compound} \rightarrow FTO(\ )+\text{oxidation products} \tag{16b}$$

Figure 4:
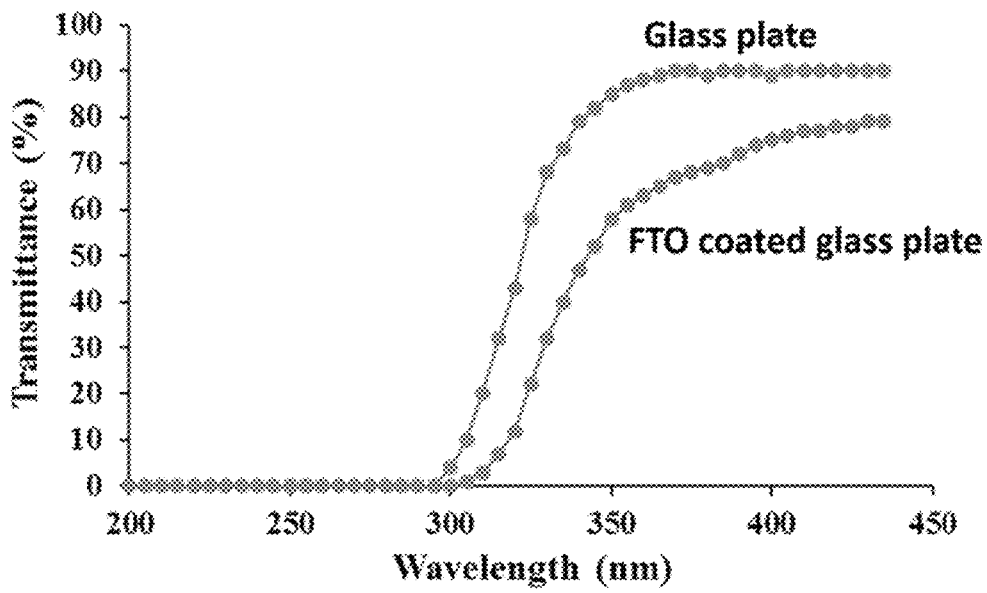
FIG. 4 shows transmissivity spectrum of FTO coated and uncoated glass plates.

This characteristic is very compelling because it implies the use of FTO as an anode in EAOP technology provides an additional source of ˙OH that enhances the whole process efficiency. The transmissivity of FTO coated glass is shown in FIG. 4 and compared to the spectrum of uncoated glass (used as a control) for wavelengths ranging from 200 nm to 435 nm. For the purpose of the UV based process as discussed in the present disclosure, the wavelengths from 320 nm to 400 nm, which correspond to the UVA range (the most abundant UV radiation provided by the sun), are of prime importance. All the glass plates show no or little (approximately 1% to 2%) transmittance at wavelengths below 300 nm. At 365 nm, corresponding to the UV lamp wavelength, glass showed about 90% transmittance while 65% transmittance was observed with FTO coated plate. This demonstrates that FTO allows sufficient UV light to pass through in order for photolytic and photocatalytic processes to occur.

Therefore, FTO anode is not only a non-active anode that produces reactive ˙OH at its surface but also a sufficiently transparent material to allow for UV penetration. The benefits from these two properties of FTO were further explored in UV based EAOPs, including their combination with TiO2 to promote PC mechanisms.

Figure 5:
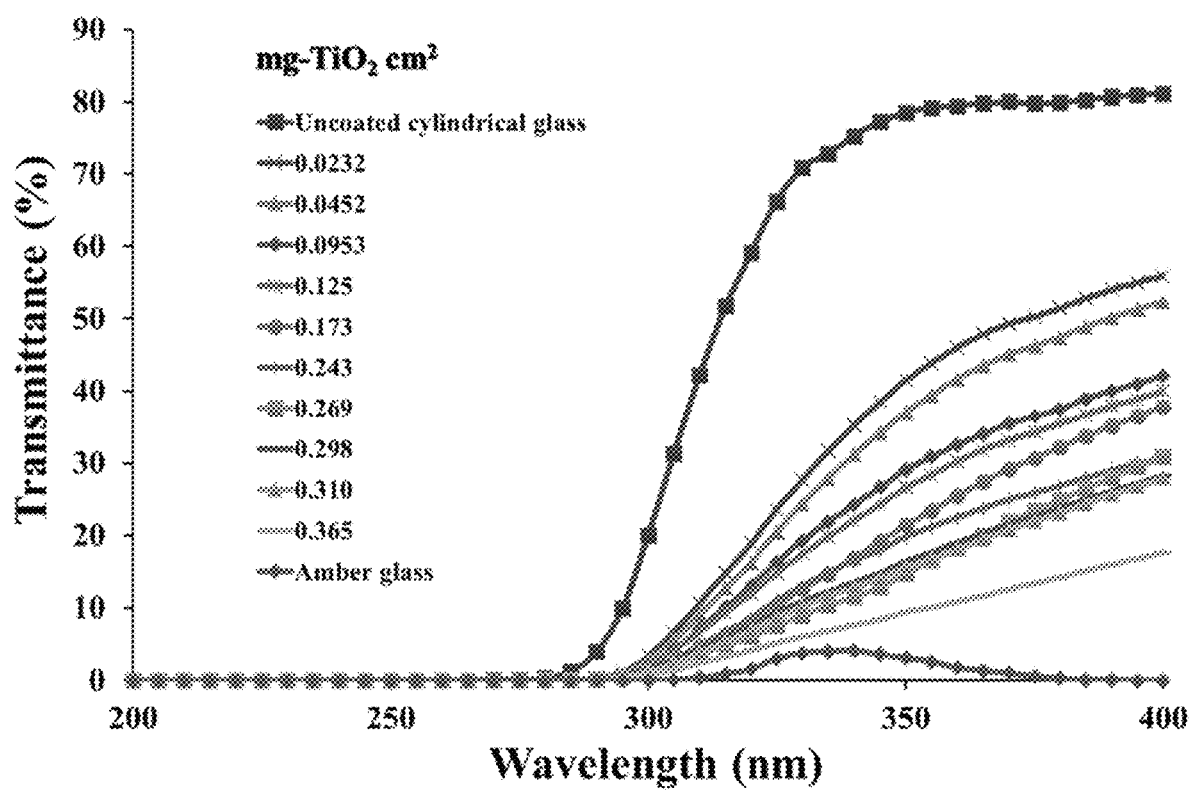
FIG. 5 shows the transmissivity of cylindrical stirred glass reactor coated with varying $TiO_2$ concentrations.

Example 8: Results and Discussion—Transmissivity of TiO$_2$ Coated Cylindrical Glass To understand the relationship between concentration of TiO$_2$ and transmissivity of the cylindrical reactor, the transmissivity of TiO$_2$ coated cylindrical glass was first determined at different TiO$_2$ loading (see FIG. 5). It was observed that as the concentration of TiO$_2$ increased from 0 to 0.365 mg cm$^{-2}$, the transmissivity of the coated reactor decreased from 80% at 365 nm to 12%. In comparison, the transmittance was 50% at the lowest TiO$_2$ loading (0.0232 mg cm$^{-2}$) at 365 nm. When tested with amber glass, which does not let wavelengths below 400 nm pass through, the transmittance achieved was the lowest amongst all tests at 1% at 365 nm. With these findings, increasing the TiO$_2$ concentration excessively would have an adverse effect on the efficiency of pollutant degradation, which relies heavily on UV irradiation. To further demonstrate the relationship between TiO$_2$ loading and efficiency of pollutant removal, this was investigated by monitoring the rates of MB degradation using a variety of TiO$_2$ concentrations.

Example 9: Results and Discussion—Methylene Blue (MB) Degradation as a Function of TiO$_2$ Concentration As mentioned above, FTO anode is a non-active anode that produces reactive ˙OH at its surface and a sufficiently transparent material to allow for UV penetration. This allowed maximization of TiO$_2$ concentration based on pseudo-first order kinetic model applied to the degradation of MB. The optimal TiO$_2$ loading is 0.311 mg cm$^{-2}$. Overall the degradation rate constant improves from one order of magnitude due to TiO$_2$ (from <0.001 to >0.01 min$^{-1}$). The kinetic model is discussed as follows.

The kinetics of photocatalytic degradation of MB was monitored for different concentrations of TiO$_2$ as a thin film coating. The Langmuir-Hinshelwood model is the most common expression applied to carry out the kinetics of heterogeneous PC batch systems (equation 17):

$$r = -\frac{dC}{dt} = \frac{k_{L-H}KC}{1+KC} \tag{17}$$

where r represents the rate of PC degradation (mol litre$^{-1}$ min$^{-1}$), $k_{L-H}$ is the Langmuir-Hinshelwood rate constant (mol litre$^{-1}$ min$^{-1}$), K is the equilibrium constant for adsorption of the pollutant onto the photocatalyst (litre mol$^{-1}$) and C is the concentration of the pollutant (mol litre$^{-1}$).

It is often considered for low pollutant concentration that KC is negligible beyond 1 (KC<<1), which means that equation 17 can be simplified as a first order equation to become equation 18:

$$r = -\frac{dC}{dt} = k_{L-H}KC = k_{app}C \tag{18}$$

where $\kappa_{app}$ is the pseudo-first order kinetic model ($\kappa_{app} = \kappa_{L-H}C$).

After integration of equation 18 from time t=0 to irradiation time t, the following relation can be obtained as equation 19:

$$\ln\frac{C_0}{C} = k_{app}t \tag{19}$$

where C$_0$ is the initial concentration of the contaminant (mol litre$^{-1}$).

Figure 6A:
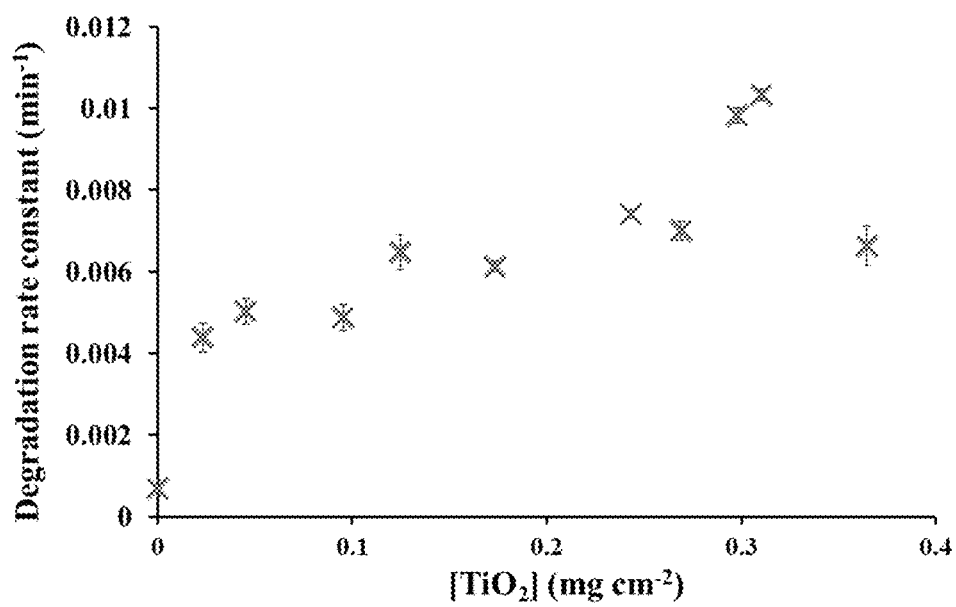
FIG. 6A shows the methylene blue (MB) photocatalytic (PC) degradation rate constants as a function of $TiO_2$ concentration of thin film coating.

This pseudo-first order kinetic model was applied to the kinetics of PC degradation of MB by plotting the semi-logarithmic graph from equation 19. The model fitted the experimental data well with correlation coefficients (R$^2$) higher than 0.981. This pseudo-first order is consistent with trends found in published works, especially during the TiO$_2$ heterogeneous PC of MB. The kinetics rate constants were then plotted against the respective TiO$_2$ loading as illustrated in FIG. 6A.

Figure 6B:
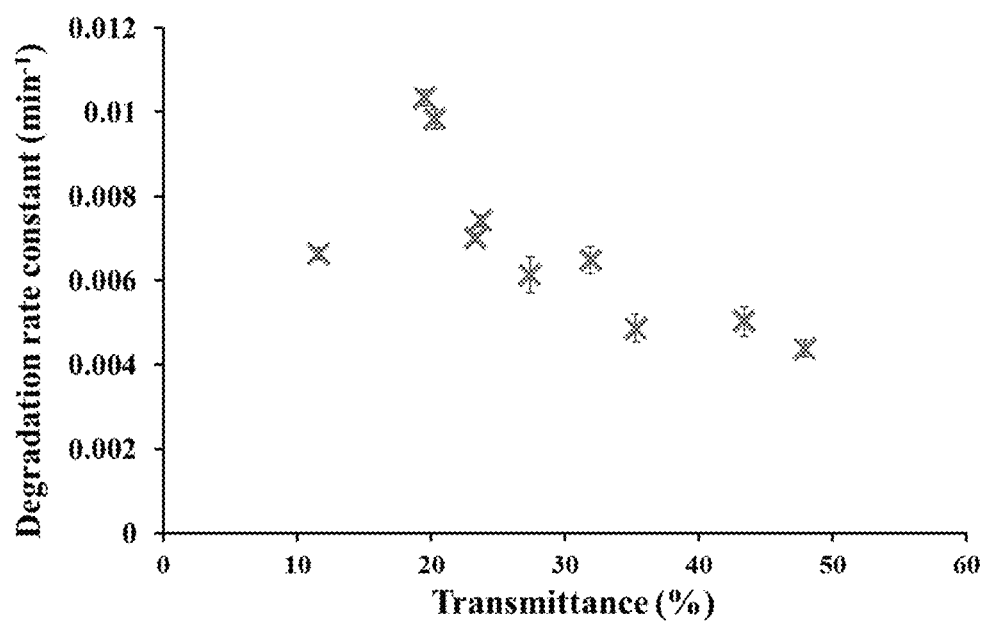
FIG. 6B shows the MB PC degradation rate constants as a function of transmissivity (365 nm) of thin film coating.

First, it can be seen that TiO$_2$ PC was effective in degrading MB since a kinetics rate of 0.0044 min$^{-1}$ was observed with the lowest TiO$_2$ concentration (0.023 mg cm$^{-2}$) as compared to the absence of TiO$_2$ (0.0007 min$^{-1}$), which constituted a 6.3 fold improvement. Increasing the TiO$_2$ concentration from 0.023 to 0.311 mg cm$^{-2}$ further increased the rate of MB degradation from 0.0044 to 0.0103 min$^{-1}$, which could be attributed to the increasing number of photoactive sites that raised the ˙OH production by heterogeneous PC. It is then deduced that the optimal TiO$_2$ concentration was around 0.311±0.01 mg cm$^{-2}$. At this concentration and degradation rate, the transmissivity was around 20% at 365 nm (FIG. 6B) and overall degradation was almost 65% after 90 mins of PC alone. At higher TiO$_2$ loading (0.345 mg cm$^{-2}$) with a transmissivity of 12% at 365 nm, the kinetic rate dropped to 0.0066 min$^{-1}$, as further depicted in FIG. 6B. It seems that transmissivities lower than 20% hampered UV light going through the glass reactor which limited the availability of TiO$_2$ photoactive sites with the UV light. The role of transmissivity have been reported in other literatures but not in a quantitative manner as carried out in the present disclosure. The optimal TiO$_2$ loading of 0.311 mg cm$^{-2}$ was applied for subsequent experiments combining photo-electrocatalytic processes in stirred glass reactor (see example 11) and in 3D printed flow-cell reactors (see examples 12 and 13).

Example 10: Results and Discussion—Stability of TiO$_2$ Coating

Figure 7A:
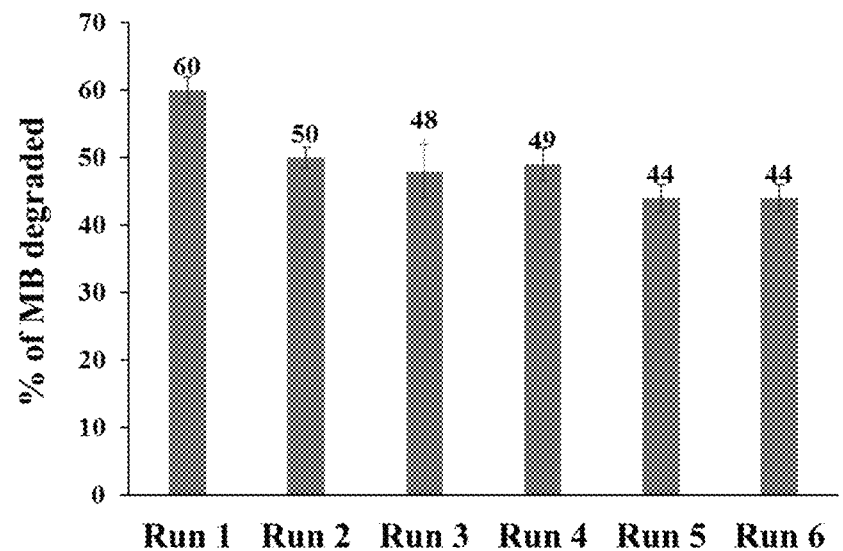
FIG. 7A illustrates the stability of $TiO_2$ coating for PC degradation of MB over 6 successive runs of 90 mins each.
Figure 7B:
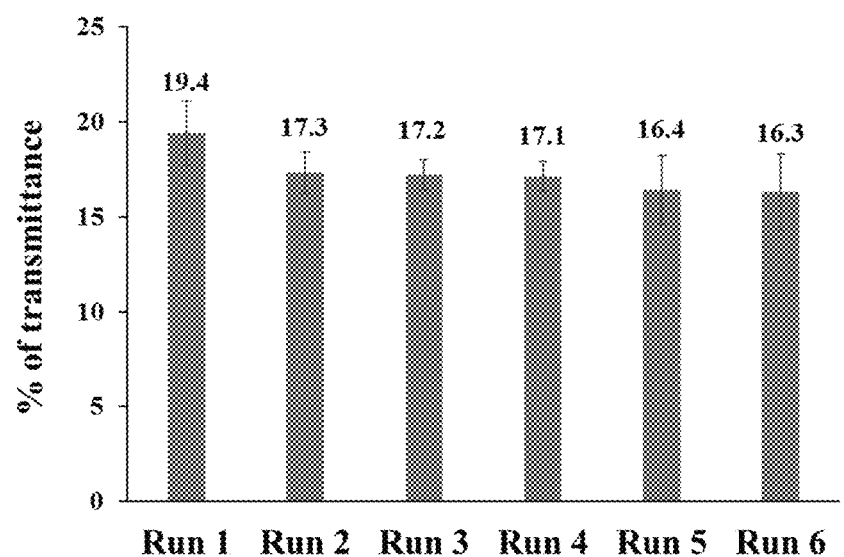
FIG. 7B illustrates the transmissivity (365 nm) of $TiO_2$ coating for PC degradation of MB over 6 successive runs of 90 mins each.

Coating stability is an important feature when industrial applications are considered. Thus, it was assessed by performing 6 successive PC experiments and the percentage of MB removed after 90 mins of irradiation is displayed in FIG. 7A. A 16% decrease was observed between the $1^{st}$ and $6^{th}$ cycle, indicating a loss of treatment efficiency as the $TiO_2$ coating was reused. Observably, the loss of efficiency was higher between the $1^{st}$ and $2^{nd}$ cycle (10%) and then remained marginal between each of the runs from the $2^{nd}$ and the $6^{th}$ cycle (6%). This is further in agreement with the transmissivity results displayed in FIG. 7B, with a decrease of transmittance from 19.4% to 17.3% after 2 runs, while it dropped to 16.3% after 6 runs. After 5 runs, the $TiO_2$ coating appeared stabilized. This phenomenon may be because the external layer of $TiO_2$ was too weakly bound to the $TiO_2$ sublayer so it was more easily removed from the glass substrate between the $1^{st}$ and $2^{nd}$ stage.

Figure 7C:
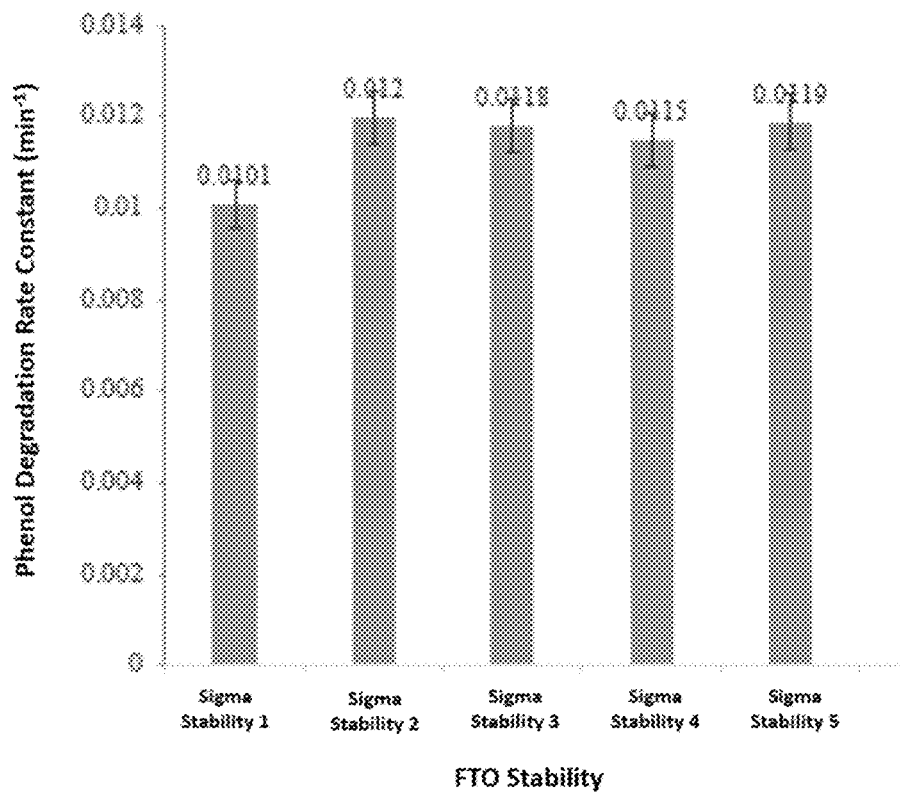
FIG. 7C illustrates the stability of FTO coating using EA/AO degradation of phenol over 5 successive runs of 90 mins each.

The stability of FTO was also evaluated using phenol. FIG. 7C shows the stability of FTO coating for EA/AO degradation of phenol over 5 successive runs of 90 mins each. By the $5^{th}$ run, the FTO coating remains stabilized, demonstrating that the FTO used did not degrade over time.

Example 11: Results and Discussion—Combination of PEF and PC in Stirred Glass Reactor The testing of the electrodes in lab-scale stirred glass reactor conditions was preliminary needed before examining the efficiency of 3D printed reactors in order to figure out whether the FTO transparent electrode employed and the $TiO_2$ coated glass substrate conditions used implied a significant improvement in the pollutant removal efficiency. The kinetics decay rate constants of phenol were determined by considering a pseudo-first order kinetic model for phenol degradation assuming a quasi-steady state approximation of the •OH concentration evolution, which happens to be a frequent model applied for homogeneous catalysis. Good correlations (all $R^2 > 0.980$) were noticed between the experimental data and the kinetics model, thus validating the choice of kinetic model used.

This was also carried out to showcase the synergy achieved with multiple sources of hydroxyl radicals, which demonstrated very high mineralization efficiencies. The combined photo-electrocatalytic Fenton process reaches a degradation rate of 0.0168 $min^{-1}$ and a mineralization yield as high as 97% after 8 hours of treatment. This is more superior than each individual process performed.

Figure 8A:
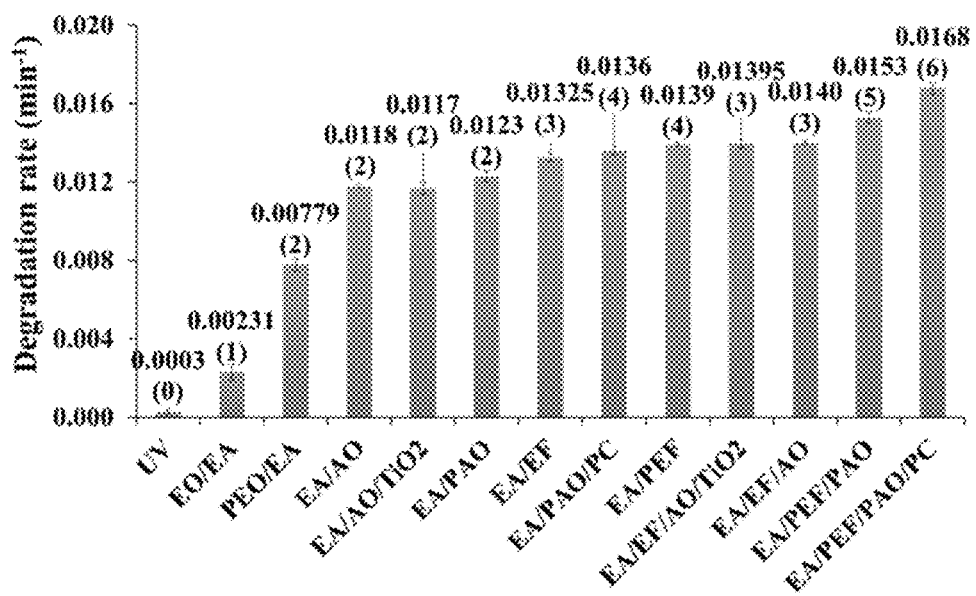
FIG. 8A shows a comparison of phenol (1.4 mM) degradation rate. Operating conditions were at current density of 1.25 mA cm$^{-2}$, [Fe$^{2+}$] of 0.1 mM (when required) and $TiO_2$ concentration of 0.311 mg cm$^{-2}$ (when required). Values in parenthesis represent the number of ˙OH sources involved in the process.
Figure 8B:
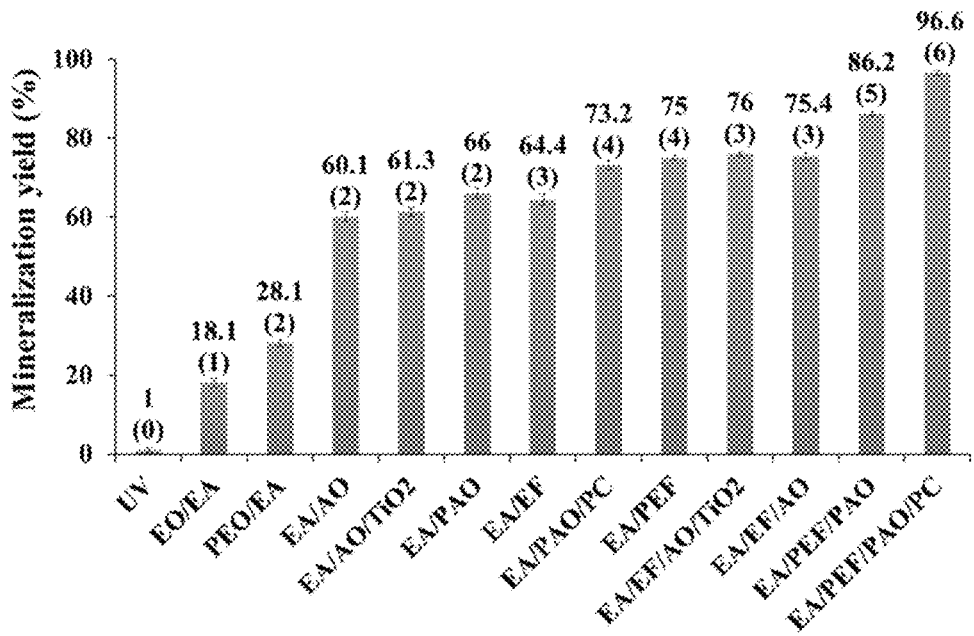
FIG. 8B shows a comparison of phenol (1.4 mM) mineralization yields after 8 hours. Operating conditions were at current density of 1.25 mA cm$^{-2}$, [Fe$^{2+}$] of 0.1 mM (when required) and $TiO_2$ concentration of 0.311 mg cm$^{-2}$ (when required). Values in parenthesis represent the number of ˙OH sources involved in the process.

The phenol degradation rate and mineralization yield (after 8 hours of treatment) were compared (FIGS. 8A and 8B, respectively) for all 13 types of processes (including the UV control experiment) susceptible to take place under various operating conditions (compare with Table 1): UV, EO/EA, EA/AO, PEO/EA, EA/PAO, EA/EF, EA/EF/AO, EA/PEF, EA/PEF/PAO, EA/AO/$TiO_2$, EA/PAO/PC, EA/EF/AO/$TiO_2$, EA/PEF/PAO/PC. A control experiment was previously performed under UV light but in the absence of current density and without the presence of $Fe^{2+}$ and $TiO_2$.

In the absence of current density and without the presence of $Fe^{2+}$ and $TiO_2$, UV light alone resulted in no significant degradation and mineralization (0.0003±0.0001 $min^{-1}$ and 1±0.5%, respectively) after 8 hours. This shows that phenol is not photosensitive and thus, in the absence of photocatalyst, $H_2O_2$ and/or the ferric-hydroxy complex breaks down to produce •OH, the TOC concentration remained unchanged.

As more sources of •OH were added to the system, the general trend was that the higher the number of sources of hydroxyl radicals, the greater the rate of degradation and mineralization yield as shown by the following mineralization yield rank efficiency (with number of •OH source in brackets) (see Table 2 below): UV (0)<EO/EA (1)<PEO/EA (2)<EA/AO (2)≈EA/AO/$TiO_2$ (2)<EA/EF (2)<EA/PAO (3)<EA/EF/AO/$TiO_2$ (3)≈EA/EF/AO (3)≈EA/PAO/PC (4)≈EA/PEF (4)<EA/PEF/PAO (5)<EA/PEF/PAO/PC (6). However, this general trend has to be cautiously applied because not all sources of •OH contribute the same treatment efficiency as discussed below.

TABLE 2

Influence of Different Sources of Hydroxyl Radicals on Mineralization Yield Efficiency.

| Source of •OH | Description | Reaction mechanism | UV | EO/EA | PEO/EA | EA/AO | EA/AO $TiO_2$ |
|---|---|---|---|---|---|---|---|
| i | $H_2O_2$ electro-activation | $H_2O_2 + e^- \rightarrow$ •OH + $HO^-$ | | ✓ | ✓ | ✓ | ✓ |
| ii | Anodic Oxidation | $H_2O \rightarrow$ •OH + $H^+ + e^-$ | | | | ✓ | ✓ |
| iii | $H_2O_2$ photolysis | $H_2O_2 + h\nu \rightarrow 2$ •OH | | | ✓ | | |
| iv | Fenton reaction | $H_2O_2 + Fe^{2+} \rightarrow Fe^{3+} +$ •OH + $HO^-$ | | | | | |
| v | Fe(III)-hydroxy complex photolysis | $Fe(OH)^{2+} + h\nu \rightarrow Fe^{2+} +$ •OH | | | | | |

TABLE 2-continued

Influence of Different Sources of Hydroxyl Radicals on Mineralization Yield Efficiency.

| | | | | | | | |
|---|---|---|---|---|---|---|---|
| vi | $TiO_2$ photocatalysis | $TiO_2 + h\nu \rightarrow e_{cb}^- + h_{vb}^-$ $h_{vb}^+ + H_2O \rightarrow \bullet OH + H^-$ $h_{vb}^+ + OH^- \rightarrow \bullet OH + H^-$ | | | | | |
| | Total sources of •OH | | 0 | 1 | 2 | 2 | 2 |
| | Degradation rat constant (min$^{-1}$) | | $0.0003 \pm 0.0001$ | $0.00231 \pm 0.0004$ | $0.00779 \pm 0.0003$ | $0.0118 \pm 0.0001$ | $0.0117 \pm 0.0003$ |
| | Mineralization yield (%) after 8 h of treatment | | $1 \pm 0.5\%$ | $18.1 \pm 1.1\%$ | $28.1 \pm 0.9\%$ | $60.1 \pm 1.2\%$ | $61.3 \pm 1.1\%$ |

| | | | Experimental Conditions | | | |
|---|---|---|---|---|---|---|
| Source of •OH | Description | Reaction mechanism | EA/EF | EA/PAO | EA/PAO/PC | EA/PEF |
| i | $H_2O_2$ electro-activation | $H_2O_2 + e^- \rightarrow \bullet OH + HO^-$ | ✓ | ✓ | ✓ | ✓ |
| ii | Anodic Oxidation | $H_2O \rightarrow \bullet OH + H^+ + e^-$ | | ✓ | ✓ | |
| iii | $H_2O_2$ photolysis | $H_2O_2 + h\nu \rightarrow 2 \bullet OH$ | | | ✓ | ✓ |
| iv | Fenton reaction | $H_2O_2 + Fe^{2+} \rightarrow Fe^{3-} + \bullet OH + HO^-$ | ✓ | | | ✓ |
| v | Fe(III)-hydroxy complex photolysis | $Fe(OH)^{2+} + h\nu \rightarrow Fe^{2+} + \bullet OH$ | | | | ✓ |
| vi | $TiO_2$ photocatalysis | $TiO_2 + h\nu \rightarrow e_{cb}^- + h_{vb}^-$ $h_{vb}^+ + H_2O \rightarrow \bullet OH + H^-$ $h_{vb}^+ + OH^- \rightarrow \bullet OH + H^-$ | | | ✓ | |
| | Total sources of •OH | | 3 | 2 | 4 | 4 |
| | Degradation rat constant (min$^{-1}$) | | $0.0123 \pm 0.0003$ | $0.01325 \pm 0.0002$ | $0.0136 \pm 0.0002$ | $0.0139 \pm 0.0001$ |
| | Mineralization yield (%) after 8 h of treatment | | $66.0 \pm 1.3\%$ | $64.4 \pm 1.4\%$ | $73.2 \pm 1.2\%$ | $75.0 \pm 0.6\%$ |

| | | | Experimental Conditions | | | |
|---|---|---|---|---|---|---|
| Source of •OH | Description | Reaction mechanism | EA/EF/AO | EA/EF AO/$TiO_2$ | EA/PEF/PAO | EA/PEF/PAO/PC |
| i | $H_2O_2$ electro-activation | $H_2O_2 + e^- \rightarrow \bullet OH + HO^-$ | ✓ | ✓ | ✓ | ✓ |
| ii | Anodic Oxidation | $H_2O \rightarrow \bullet OH + H^+ + e^-$ | ✓ | ✓ | ✓ | ✓ |
| iii | $H_2O_2$ photolysis | $H_2O_2 + h\nu \rightarrow 2 \bullet OH$ | | | ✓ | ✓ |
| iv | Fenton reaction | $H_2O_2 + Fe^{2+} \rightarrow Fe^{3-} + \bullet OH + HO^-$ | ✓ | ✓ | ✓ | ✓ |
| v | Fe(III)-hydroxy complex photolysis | $Fe(OH)^{2+} + h\nu \rightarrow Fe^{2+} + \bullet OH$ | | | ✓ | ✓ |
| vi | $TiO_2$ photocatalysis | $TiO_2 + h\nu \rightarrow e_{cb}^- + h_{vb}^-$ $h_{vb}^+ + H_2O \rightarrow \bullet OH + H^-$ $h_{vb}^+ + OH^- \rightarrow \bullet OH + H^-$ | | | | ✓ |
| | Total sources of •OH | | 3 | 3 | 5 | 6 |
| | Degradation rat constant (min$^{-1}$) | | $0.01395 \pm 0.0002$ | $0.0140 \pm 0.0001$ | $0.0153 \pm 0.0003$ | $0.0168 \pm 0.0003$ |
| | Mineralization yield (%) after 8 h of treatment | | $76.0 \pm 0.8\%$ | $75.4 \pm 0.5\%$ | $86.2 \pm 0.5\%$ | $96.6 \pm 0.6\%$ |

In the EO/EA experiment, the EO process could be considered negligible in the presence of Pt anode that is an active anode and therefore no production of physisorbed ˙OH occurred. The EO of phenol was then assumed insignificant in all other processes studied. Still, results demonstrate an 0.00231 min$^{-1}$ degradation rate constant and an 18.1% mineralization yield after 8 hours of experiment. The reduction of $O_2$ to $H_2O_2$ still occurred at the carbon cathode, however, $H_2O_2$ has an oxidative potential of 1.776 V vs SHE that is insufficient to degrade or mineralize phenol. Therefore, the $H_2O_2$ generated at the cathode may not be the explanation for the degradation or mineralization achieved. According to available literatures, it was suggested that in situ generation of ˙OH was observed via electro-activation of $H_2O_2$ (see equation 7). EA is thus a suitable explanation for the 0.00231 min$^{-1}$ degradation rate and 18.1% mineralization observed in the EO/EA experiment.

The introduction of UV irradiation in PEO/EA experiments increased the degradation rate from 0.00231 min$^{-1}$ to 0.00779 min$^{-1}$ and the mineralization yield from 18.1% to 28.1% due to homolytic cleavage of $H_2O_2$ under UV (see equation 14) to give a second source of ˙OH.

The yield of ˙OH produced from AO at the FTO anode in EA/AO and EA/AO/TiO$_2$ processes resulted in a 2.1 times higher degradation efficiency and better mineralization efficiency (around 42%) than UV homolytic cleavage of $H_2O_2$ in PEO/EA process after deducing the contribution of EA. As expected, EA/AO and EA/AO/TiO$_2$ processes led to the same degradation rate (around 0.01175±0.00005 min$^{-1}$) and mineralization yield (around 60.7±1.2%) as TiO$_2$ provides no removal in the absence of UV light, which was also apparent by comparing the results of EA/EF/AO and EA/EF/AO/TiO$_2$ with comparable degradation rate (around 0.01398±0.00003 min$^{-1}$) and mineralization yield (around 75.7±0.7%) in both cases.

Moreover, the differences of degradation rate and mineralization yield between EA/PAO (0.01325±0.0002 min$^{-1}$ and 64.4±1.4%) and EA/AO (0.0118±0.0001 min$^{-1}$ and 60.1±1.2%) highlighted a slight improvement (12% increase of degradation rate and 4.3% higher mineralization yield), which again could be accredited to the additional source of ˙OH from $H_2O_2$ photolysis (see equation 14).

The addition of Fenton catalyst ($Fe^{2+}$) in EA/EF process led to a dramatic increase in degradation rate and mineralization yield of 0.0123±0.0003 min$^{-1}$ and 66.0±1.3%, close to EA/PAO process efficiency. This was more than 3.7- to 5.3-fold increase as compared to EO/EA while 4% increase of degradation rate and 6% higher mineralization yield as compared to EA/AO was noticed. Since both EA/EF and EA/AO implement two sources of ˙OH, the superiority of Fenton reaction over anodic oxidation is emphasized. Therefore, it was clear that Fenton reagent has the ability to greatly increase the efficacy of catalytic treatment systems.

Furthermore, photocatalytic mineralization through the catalyst TiO$_2$ in EA/PAO/PC experiments demonstrated an increase of degradation rate (0.0136±0.0002 min$^{-1}$) and mineralization yield (73.2±1.2%) efficiency as compared to EA/PAO (0.01325±0.0002 min$^{-1}$ and 64.4±1.4%, respectively).

The UV irradiation in Fenton process provides an increase of the degradation rate from 0.0123±0.0003 min$^{-1}$ to 0.0139±0.0001 min$^{-1}$ and mineralization yield from 66.0±1.3% to 75.0±0.6% in EA/EF and EA/PEF systems respectively, which was attributed to the two sources of ˙OH that were introduced from $H_2O_2$ photolysis (equation 14) and ferric-hydroxy complex photolysis (equation 2).

In the same way, UV light in EA/PEF/PAO implies enhancement of degradation rate from 0.01395±0.0002 min$^{-1}$ to 0.0153±0.0003 min$^{-1}$ and mineralization yield from 76.0±0.8% to 86.2±0.5% due to the same two additional ˙OH sources. Thus, the additional 10% increase of degradation rate and higher mineralization yield of 10% justify the use of UV irradiation in EF systems. When TiO$_2$ was supplemented in EA/PEF/PAO/PC experiments, the degradation rate and the mineralization degree were further raised to 0.0168±0.0003 min$^{-1}$ and 96.6±0.6% respectively that was attributed to the sixth ˙OH source from TiO$_2$ PC (see equations 8 to 10). This finding indicates that TiO$_2$ is effective both with and without the application of Fenton reagent, conditional on the use of UV irradiation. To highlight the possible synergetic effect in the presence of UV ($S_{UV}$), the following ratio has been calculated (equation 20):

$$S_{UV} = \frac{\eta_{EA/PEF/PAO}}{\eta_{EA/PAO} + \eta_{EA/EF/AO}} \quad (20)$$

with $\eta_{EA/PEF/PAO} = \frac{k_{EA/PEF/PAO/PC}}{k_{EA/AO}}$, $\eta_{EA/PAO} = \frac{k_{EA/PAO}}{k_{EA/AO}}$ and $\eta_{EA/EF/AO} = \frac{k_{EA/EF/AO}}{k_{EA/AO}}$ where $\eta_{EA/PEF/PAO}$, $\eta_{EA/PAO}$ and $\eta_{EA/EF/AO}$ are the percentages of enhancement of EA/PEF/PAO, EA/PAO and EA/EF/AO processes, respectively, compared to EA/AO process, and $\kappa_{EA/PEF/PAO}$, $\kappa_{EA/PAO}$, $\kappa_{EA/EF/AO}$ and $\kappa_{EA/AO}$ are the pseudo-first order kinetics rate degradation constants of EA/PEF/PAO, EA/PAO, EA/EF/AO and EA/AO process, respectively (min$^{-1}$).

According to equation 20, $S_{uv}$ value equaled 0.97 in uncoated stirred glass reactor, meaning that UV did not bring any synergy. In the absence of TiO$_2$, only $H_2O_2$ photolysis (equation 14) and Fe(III)hydroxyl complexes (equation 2b) could occur in the combined processes. However, $H_2O_2$ and Fe(III) are also required to implement the Fenton reaction (equation 1) and the $H_2O_2$ electro-activation (equation 7), which means that UV-based equations (equations 2b; 14) are in competition with equations 1 and 7. To further emphasize the possible synergy in presence of TiO$_2$ photocatalyst ($S_{PC}$), this was determined as follow:

$$S_{PC} = \frac{\eta_{EA/PEF/PAO/PC}}{\eta_{EA/PAO/PC} + \eta_{EA/EF/AO}} \quad (21)$$

with $\eta_{EA/PEF/PAO/PC} = \frac{k_{EA/PEF/PAO}}{k_{EA/AO}}$ and $\eta_{EA/PAO/PC} = \frac{k_{EA/PAO/PC}}{k_{EA/AO}}$ where $\eta_{EA/PEF/PAO/PC}$ and $\eta_{EA/PAO/PC}$ are the percentages of enhancement of EA/PEF/PAO/PC and EA/PAO/PC processes, respectively, compared to EA/AO process, and $\kappa_{EA/PEF/PAO/PC}$ and $\kappa_{EA/PAO/PC}$ are the pseudo-first order kinetics rate degradation constants of EA/PEF/PAO/PC and EA/PAO/PC process, respectively (min$^{-1}$).

In a TiO$_2$-coated stirred glass reactor, $S_{PC}$ value could reach 1.26 that was higher than 1. In this case, the synergy brought by the addition of TiO$_2$ could be noticed. TiO$_2$ PC (equations 8 to 10) does not compete with other mechanisms that are sources of •OH and can even increase the rate of •OH production through some other mechanisms (equations 1 and 7) by raising the accumulation of $H_2O_2$ (equations 12-13).

Still the influence of UV light on the whole pollutant removal appears too low, with $S_{UV}$ value lower than 1. It was therefore suggested to increase the contribution attainable from UVA irradiation by improving the reactor design to treat phenol in a 3D printed reactor.

Notwithstanding the above, the stirred glass reactor has a simple design (batch) which is sufficient to show the synergy of combining electro-Fenton and $UV/TiO_2$. When the processes are combined (EA/PEF/PAO/PC; with 6 sources of •OH), an increase of 42% ($\eta_{EA/PEF/PAO/PC}$) is attained, which is 9% higher than what was originally expected based on the improvement observed with the addition of each processes. Originally, the improvement was expected to be a sum of the increase from EA/AO to EA/EF/AO (18%) ($\eta_{EA/EF/AO}$) and EA/AO to EA/PAO/PC (15%) ($\eta_{EA/PAO/PC}$), which would have been 33% (see FIG. 8A). Hence, this demonstrates the combination of various processes within a single reactor definitely has an unexpected synergetic effect.

Example 12: Results and Discussion—Reactor Design Selection

The 3D printed reactors (see FIG. 2A to 2C) were built with the following criteria in mind to allow for a meaningful comparison with the glass reactor: (i) ensure no leakage of solution, (ii) ensure that the solution flowing through is fully saturated with oxygen, (iii) fully utilize the surface areas of the electrodes and (iv) optimize use of UVA.

Figure 9A:
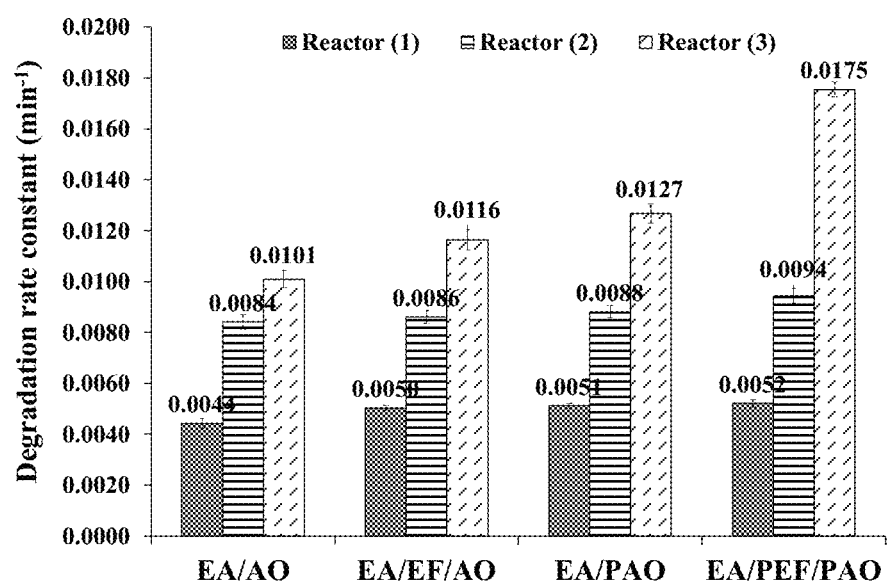
FIG. 9A shows a comparison of kinetic rate constants for phenol degradation in the three 3D printed reactors, given a pseudo-first order model and in four different conditions: EA/AO, EA/PAO, EA/EF/AO and EA/PEF/PAO (current density=1.25 mA cm$^{-2}$, [Fe$^{2+}$]=0.1 mM (when required)).

Three flow-cell reactors with different designs were therefore tested in four different operating conditions (EA/AO, EA/PAO, EA/EF/AO, EA/PEF/PAO) and their impacts on phenol degradation efficiency is displayed in FIG. 9A. All $R^2$ values were higher than 0.984, which again demonstrated the good correlation between the experimental data and the pseudo-first order kinetics model.

As mentioned earlier, reactor (1) consisted of a closed cell with $O_2$ bubbling in a separate tank. Reactor (2) allowed $O_2$ bubbling directly within the reactor. Reactor (3) is an open cell with $O_2$ bubbling in the reactor. Their performance was evaluated in terms of $H_2O_2$ production as a precursor to hydroxyl radicals.

Figure 9B:
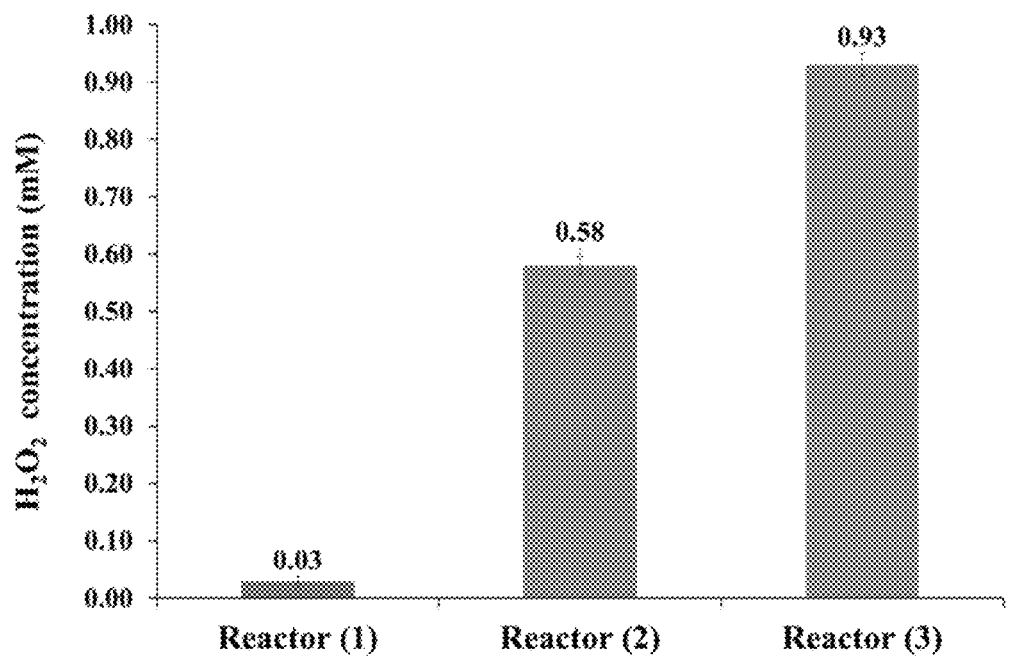
FIG. 9B shows a comparison of the maximal $H_2O_2$ accumulation in dark conditions for the three 3D printed reactors (current density=1.25 mA cm$^{-2}$, [Fe$^{2+}$]=0 mM).

Reactors (1) and (2) demonstrated the poorer performance because of insufficient availability of gaseous $O_2$ in reactor (1) and buildup of air pressure in reactor (2) (FIG. 9B). These issues were mitigated in Reactor (3).

Specifically, reactor (1) demonstrated relatively poorer performance out of all the reactor prototypes and showed no change in efficiency regardless of the operating conditions applied. As there was no separate inlet to bubble $O_2$ into the reactor (FIG. 2A), aeration was performed directly into the feeding tank. Though the solution was saturated in dissolved $O_2$, gaseous $O_2$ did not adsorb onto the surface of the cathode, leading to a negligible $H_2O_2$ production, with 0.03 mM of maximal $H_2O_2$ accumulation concentration as demonstrated by $H_2O_2$ concentration measurements in FIG. 9B. This lead to poor phenol degradation regardless of the conditions (between 0.0044±0.0002 $min^{-1}$ and 0.0051±0.0001 $min^{-1}$) because negligible •OH could be formed from either Fenton reaction (equation 1), $H_2O_2$ electro-activation (equation 7) or $H_2O_2$ photolysis (equation 14), with the ferric-hydroxy complex photolysis (equation 2) being a negligible phenomenon with carbon felt cathode as disclosed in example 11. The main source of •OH was formed through AO at the surface of FTO, which was responsible for the background decay rate constant values obtained (0.0044 $min^-$).

As an improvement, reactor (2) was conceived with $O_2$ bubbling directly into the closed electrochemical cell (FIG. 2B), resulting in a great improvement over reactor (1) as $H_2O_2$ accumulation concentration increased (0.58 mM) along with the overall degradation rate constants, ranging from 0.0084±0.0003 to 0.0094±0.0003 $min^{-1}$.

Figure 9C:
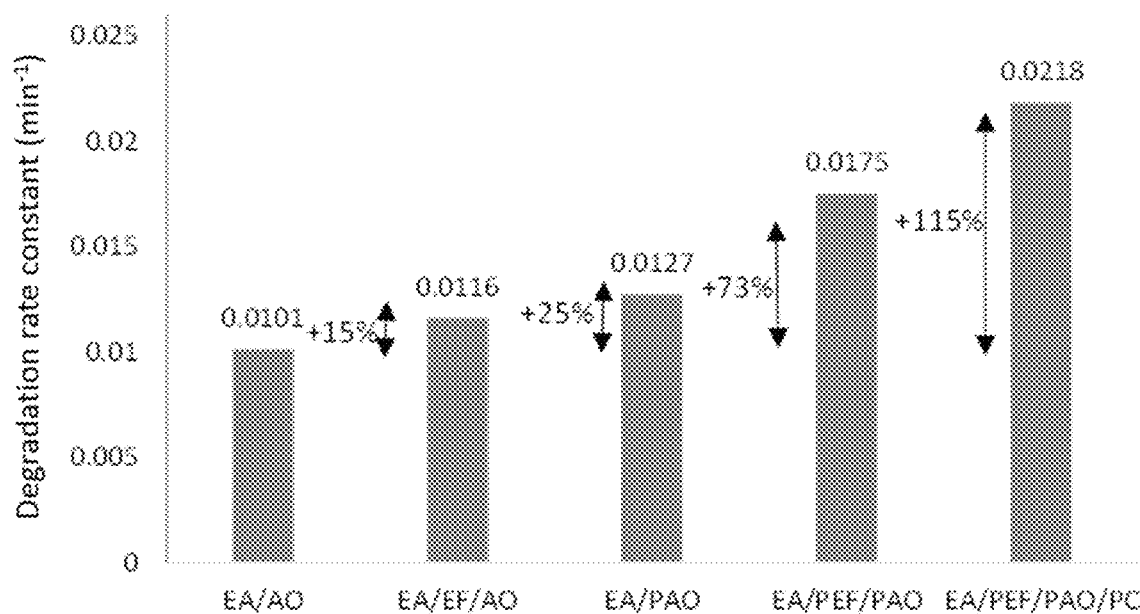
FIG. 9C shows the degradation rate constant (min$^{-1}$) for various processes using 3D printed reactor (3).

Reactor (3) is also designed for a continuous process which again shows the synergy of combining Fe and UV as compared to each of the individual processes. In this instance, the unexpected improvement was 73% ($\eta_{EA/PEF/PAO}$), which is 82.5% greater than the sum (40%) of 15% improvement from EA/AO to EA/EF/AO ($\eta_{EA/EF/AO}$) and the 25% improvement from EA/AO to EA/PAO ($\eta_{EA/PAO}$) (see FIG. 9C). The synergetic effect is more apparent in reactor (3) because of its design. Bearing the results of FIG. 9C in mind, when $TiO_2$ was supplemented in EA/PEF/PAO/PC experiments, the degradation rate was advantageously raised by 115% as compared to EA/AO due to the benefit of PC.

The findings based on reactor (2) further highlight the importance of $O_2$ in the gas state for its adsorption onto the cathode and its subsequent reduction into the 2-electrons reduction pathway to form $H_2O_2$ (see equation 5). Since carbonaceous cathodes such as carbon felt tend to be hydrophobic, they favour the gaseous $O_2$ adsorption on their surface rather than dissolved $O_2$. Still, reactor (2) suffered from the buildup of air pressure in an enclosed reactor and incomplete utilization of the electrode surface areas. As a solution, reactor (3) was opened at the top to allow the release of air pressure (FIG. 2C). To further improve the contact of $O_2$ bubbles with the cathode, small diffusion holes were added at the bottom of the final reactor (FIG. 2C). To ensure even oxygen diffusion inside the reactor, the holes near the solution inlet were made smaller and they became increasingly bigger towards the solution outlet in order to deal with the changing water pressure. These changes resulted in a vast improvement in reactor (3), with $H_2O_2$ accumulation concentration of 0.93 mM and rate constants ranging from 0.0101±0.0003 $min^{-1}$ to 0.0175±0.0003 $min^{-1}$ (FIG. 9A). As compared to experiments in reactor (2), a higher enhancement was observed between PAO and PEF/PAO over the AO and EF/AO experiments, and this could be attributed to the higher rates and yields of $H_2O_2$ accumulation in reactor (3) as shown in FIG. 9B. This led to the increase of •OH production yield through Fenton reaction, which is responsible for the higher removal efficiency as compared to reactors (1) and (2), and through $H_2O_2$ photolysis which is accountable for better performance of UV processes. Therefore, the superiority of reactor (3) was accredited to the two improvement of design: (i) the solution was in contact with the entire electrode surface and (ii) the fine diffusion holes at the bottom of the cathode resulted in smaller oxygen bubbles with higher surface area and improved adsorption onto the cathode.

Furthermore, the phenol removal efficiency trend for experiments carried out with reactors (2) and (3) was as follow: EA/PEF/PAO>EA/PAO>EA/EF/AO>EA/AO. Interestingly, the UV processes were better than the dark experiments, unlike the ranking established in the stirred glass experiments (see example 11).

To better assess the performance of UV processes, $S_{UV}$ parameter has been determined according to equation 20 and equaled a value as high as 1.87. Such great synergy can be attributed to the design of the reactor minimizing the distance between the two electrodes (10 mm) while maximizing the efficiency of the photolytic processes (see equations 2 and 14), and thus producing much more ·OH. Interestingly, when comparing EA/PEF/PAO process efficiency, it was observed that reactor (3) performed better (0.0175 min$^{-1}$) than the equivalent stirred glass reactor (0.0153 min$^{-1}$) to degrade phenol solutions. Additionally, the improvement of PEF over EF was much greater than that of the stirred glass experiments (50% improvement vs 15%). The synergy between the different processes is more apparent from 0.0101 to 0.0116 min$^{-1}$ for EF (15%) and 0.0127 min$^{-1}$ for UV (25%). Together, the improvement is equal to 0.0175 (75%), thereby showing an apparent synergertic effect.

Thus, the configuration of reactor (3) minimizes the distance that UV light would have to travel, thereby preventing attenuation of light intensity while retaining its capability to treat a large volume of effluent. This configuration was utilized for further improving operating conditions such as current density and Fe$^{2+}$ concentration in EA/PEF/PAO process in subsequent example 13.

Example 13: Results and Discussion—Further Improvement of Reactor (3)

Figure 10A:
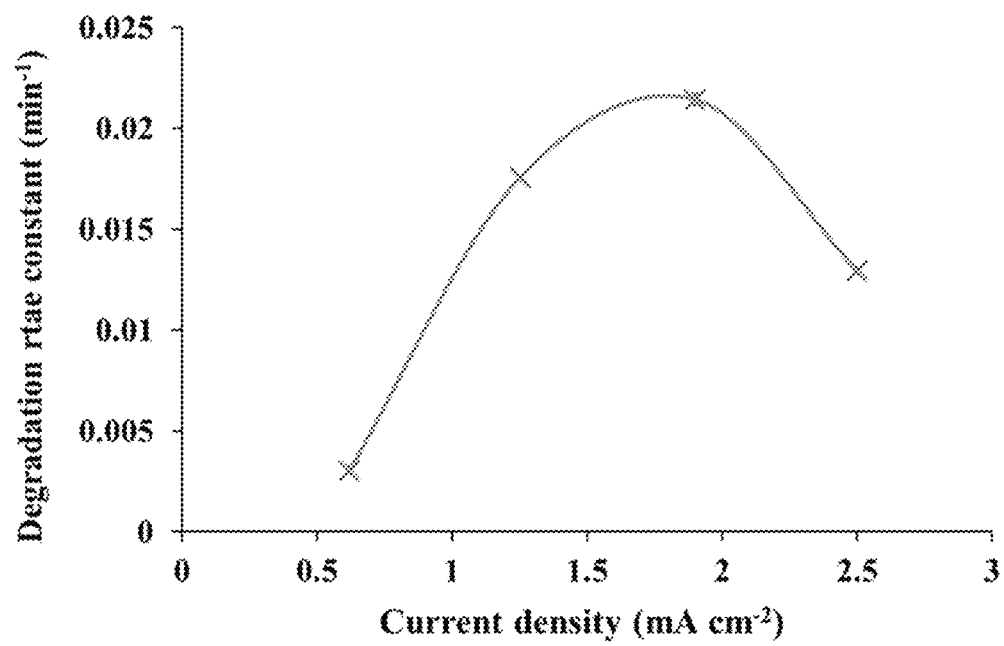
FIG. 10A shows the optimization of current density (at [Fe$^{2+}$]=0.1 mM) based on an EA/PEF/PAO process performed in reactor (3).

Improvement of the operating conditions is an important step in order to enhance process efficiency before upscale considerations. The current density was first varied between 0.62 and 2.5 mA cm$^{-2}$ and the phenol decay rate constants were determined as shown in FIG. 10A. The R$^2$ values were close to 1 (>0.987) indicating again the reliability of the pseudo-first order kinetic model.

It can be observed that the rate constants increased from 0.0030±0.0002 min$^{-1}$ to 0.0214±0.0003 min$^{-1}$ as the current density increased from 0.62 to 1.9 mA cm$^{-2}$. Raising the current density above 1.9 mA cm$^{-2}$ decreased the degradation efficiency with rate constant value of 0.0129±0.0002 min$^{-1}$ at 2.5 mA cm$^{-2}$. This phenomenon could be explained by the increased rate of waste reactions including H$_2$ evolution (see equation 22) and H$_2$O$_2$ decomposition at the anode (equations 23a and 23b), at the cathode (equation 24) and in a lesser degree in bulk solution (equation 25):

$$2H^+ + 2e^- \rightarrow H_2(g) \quad (22)$$

$$H_2O_2 \rightarrow HO_2^· + H^+ + e^- \quad (23a)$$

$$HO_2^· \rightarrow O_2 + H^+ + e^- \quad (23b)$$

$$H_2O_2 + 2H^+ + 2e^- \rightarrow 2H_2O \quad (24)$$

$$2H_2O_2 \rightarrow O_2 + 2H_2O \quad (25)$$

Figure 10B:
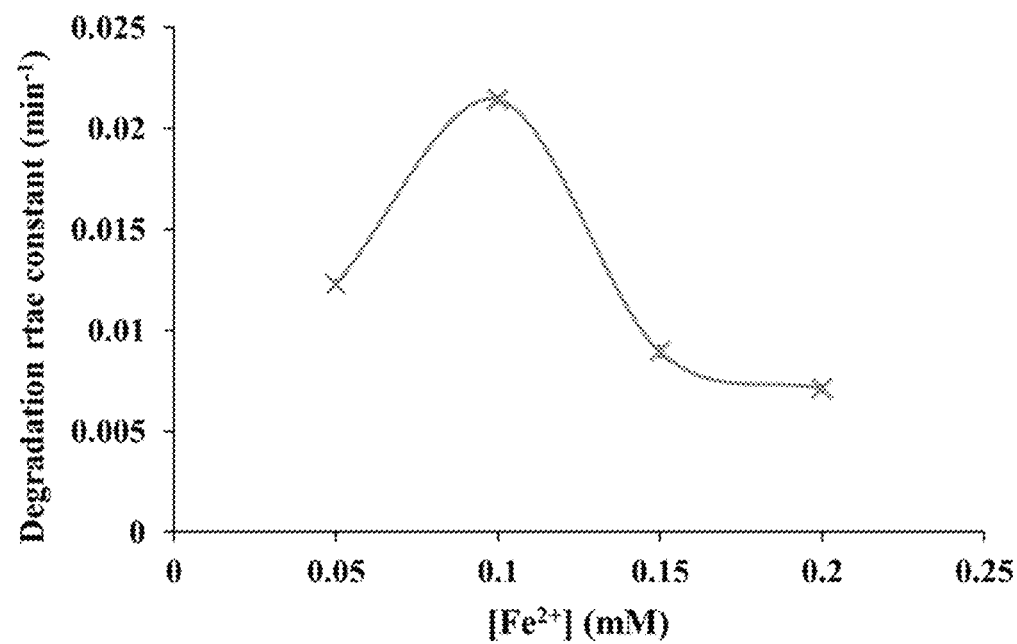
FIG. 10B shows the optimization of [Fe$^{2+}$] (at 1.9 mA cm$^{-2}$) based on an EA/PEF/PAO process performed in reactor (3).

These parasitic reactions counteracted H$_2$O$_2$ electro-generation (equation 5) and were responsible for the existence of a maximal H$_2$O$_2$ accumulation concentration in solution (example 12). The current density of 1.9 mA cm$^{-2}$ was therefore selected when proceeding to further improve the Fenton catalyst concentration (Fe$^{2+}$) from 0.05 to 0.2 mM. Again, a peak for Fe$^{2+}$ concentration is clearly shown in FIG. 10B, corresponding to a maximum kinetic rate of 0.0214 min$^{-1}$ at 0.1 mM of Fe$^{2+}$. Above this concentration, the greater extent of the unwanted reaction between Fe$^{2+}$ and ·OH (equation 26) resulted in progressive inhibition of ·OH generation:

$$Fe^{2+} + ·OH \rightarrow Fe^{3+} + HO^- \quad (26)$$

The optimum Fe$^{2+}$ concentration was thus 0.1 mM.

Further improving the operating conditions, e.g. current density and Fenton catalyst concentration, increases the efficiency of reactor (3) by 1.3 fold.

Example 14: Summary of Results and Discussion in Examples 7 to 13

Examples 7 to 13 report the implementation of six sources of ·OH in a hybrid photo-electrocatalytic Fenton glass reactor coated with TiO$_2$ as photocatalyst.

Based on the results, it is observed that without the presence of Fenton's reagent, anodic oxidation provides a stronger pathway for phenol mineralization than UV homolytic cleavage. Meanwhile, the Fenton's reagent is highly effective for phenol mineralization, especially when combined with UV irradiation, which would provide the first synergetic effect. The second synergetic effect comes from the TiO$_2$ photocatalyst, which can be synergistically combined to photo-electro-Fenton systems to significantly enhance the phenol mineralization performance. The combination of these two synergies further creates an unexpected synergetic effect as illustrated in the above examples.

The use of FTO as non-active transparent anode (O$_2$-overvoltage of 2.1 V vs SHE) and a 3D carbon felt cathode in a stirred reactor successfully chemically degraded phenol (a model pollutant) with degradation rate constant of 0.0168 min$^{-1}$ and 97% of mineralization after 8 hours of treatment. In the present systematic study carried out, Fenton and AO processes have shown great improvement in phenol degradation and mineralization in that reactor. UVA irradiation contribution could not bring synergy (S$_{UV}$=0.97) while in presence of TiO$_2$ the PC provided synergy (S$_{PC}$=1.26). A 3D printed reactor was designed as a flow-through cell to improve UV-based processes and was then optimized. Aeration was provided directly at the site of H$_2$O$_2$ production, i.e. as close as possible to the carbon cathode with an open air design in one of the 3D reactors (i.e. reactor (3)). The inter-electrode distance was kept as close as possible (1 cm in this case) in order to fully utilized photons energy through the transparent anode. Due to these configurations, the implementation of UV-based processes implied a synergy (S$_{UV}$=1.87) and yielded better degradation efficiency as compared to dark experiments and the EA/PEF/PAO process reached 14.4% increase of degradation rate as compared to the stirred glass reactor. This rate could further be increased by 22.3%, i.e. 40% increase in total, under optimized conditions of current density (1.9 mA cm$^{-2}$) and Fenton catalyst concentration (0.1 mM). The reactors thus serves as a proof-of-concept design for the novel usage of transparent electrodes, in this case FTO, to improve wastewater treatment in photo-electrocatalytic processes. The preparation of TiO$_2$ coated FTO glass may be further improve to enhance performance of the 3D-printed reactor.

Example 15: Summary of Stirred Glass Reactor Configuration and 3D Printed Reactor Configurations A summarized observation of these configurations include (1) FTO could be classified as a high O$_2$ evolution overvoltage anode (2.1 V vs SHE), (2) transmittance of $TiO_2$-coated FTO was high enough (65%) to involve photoreactions, (3) photo-electro-catalytic Fenton process was the best process in a stirred glass reactor and (4) optimized 3D-printed flow-cell could improve the UV-based processes efficiency.

Figure 11:
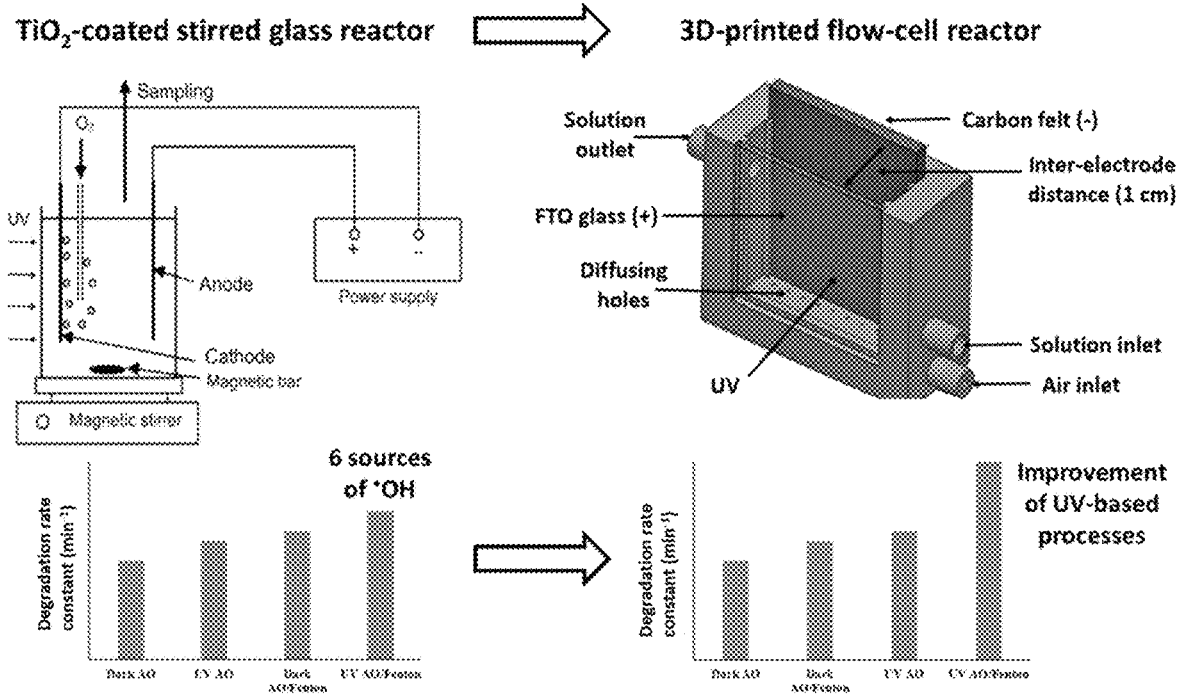
FIG. 11 shows a comparison between the stirred glass reactor configuration and an embodiment of the 3D printed cell.
Figure 12:
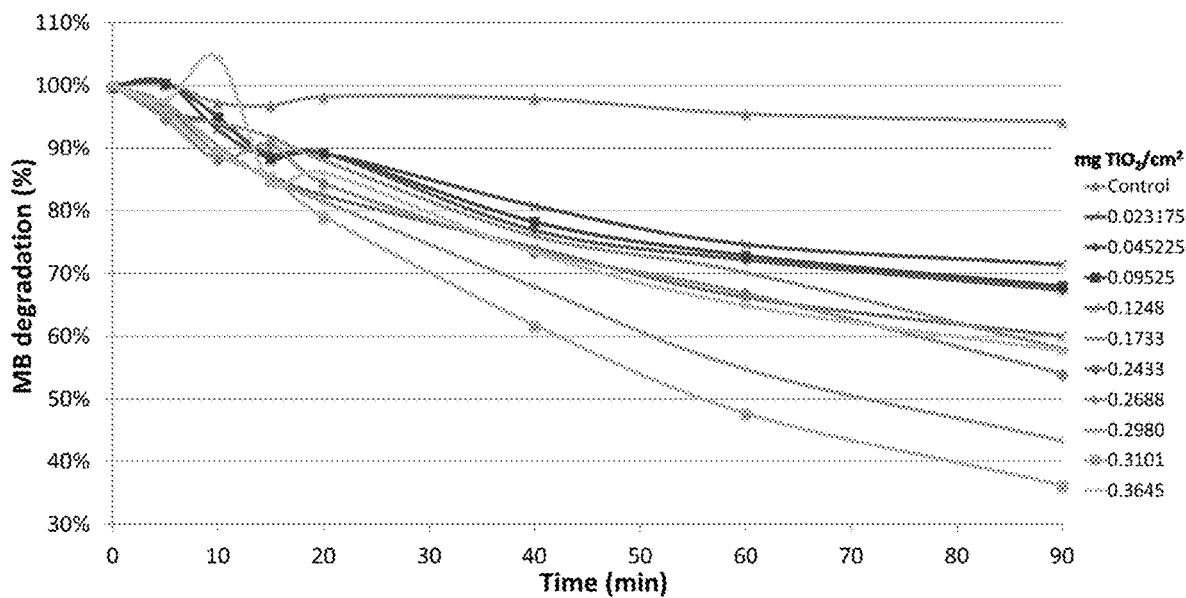
FIG. 12 shows a comparison of different $TiO_2$ concentrations and their degradation results measured on methylene blue.

The $TiO_2$-coated stirred glass reactor was designed consisting of a film of fluorine-doped tin oxide (FTO) coated on glass transparent anode and a three-dimensional (3D) porous carbon felt cathode. Linear scan voltammetry (LSV) measurements depicted for FTO an $O_2$ evolution overvoltage of 2.1 V vs SHE, high enough to form available hydroxyl radicals (OH) through anodic oxidation (AO). By letting the UVA light shine through the glass reactor coated with optimal $TiO_2$ loading (0.311 mg $cm^{-2}$), heterogeneous photocatalysis (PC) occured leading to a second source of $^{\cdot}OH$. Combined to a 3D carbonaceous cathode and addition of catalytic amount of $Fe^{2+}$, four more sources of $^{\cdot}OH$ could be implemented through $H_2O_2$ electro-activation (EA), Fenton reaction, $H_2O_2$ photolysis and Fe(III)-hydroxy complex photolysis. This combined photo-electro-catalytic Fenton process allow reaching a phenol degradation rate of 0.0168 $min^{-1}$ and a mineralization yield as high as 97% after 8 h of treatment It was far better than each individual process performed for comparison. For example, a 37% increase and a 42% increase of phenol degradation rate was observed as compared to conventional EF and AO processes, respectively. The implement of UVA irradiation without photocatalyst could enhance the removal efficiency but still the synergy ($S_{UV}$=0.97) could not be demonstrated, unlike in the presence of $TiO_2$ ($S_{PC}$=1.26). To further maximize the contribution of UVA irradiation for oxidation efficiency, the 3D printed flow-cell reactor was thus designed and employed. The electrode distance and the contact between gaseous $O_2$ and the carbon cathode were considered in the design. The UVA irradiation through the FTO anode (transmissivity of 65%) improves the kinetics of photolytic reactions by being more performant than the dark processes, with synergy value ($S_{UV}$) as high as 1.87. Due to these enhancement, the global phenol degradation rates were even higher (0.0175 $min^{-1}$) than within the stirred glass reactor (0.0153 $min^{-1}$). After optimization of current density and $Fe^{2+}$ concentration, the kinetics rate of degradation yielded 0.0214 $min^{-1}$, which is a significant improvement even before considering upscaling of such combined process. The illustrated comparison between the stirred glass reactor configuration and an embodiment of the 3D printed cell is shown in FIG. 11.

Example 16: Commercial Utility and Applications

The technology as described in the present disclosure may be used in conjunction with prospective applications that utilizes (i) solar energy as a free and infinite source of natural UV light and/or (ii) solar panels as the power source for the photoelectrochemical process. The outcome is a type of photoelectrochemical reactor as described above that harvests energy from the sun and treats water in the process.

For example, Singapore targets to generate 4 TWh/yr of solar energy. This may be achieved partly via floating photovoltaics (PV) structures on freshwater and seawater. The photoelectrochemical reactor may be coupled to these PV structures and thus the solar photoelectron-Fenton technology as discussed herein may then utilize an infinitesimal amount of this PV electricity to ensure high standards of water quality and public health.

With the above in mind, the subject matter as disclosed herein may be incorporated in the design and development of a mobile solar photoelectrochemical reactor (MSPER) with various potential applications in both engineered and natural environments.

Applications in engineered and natural environments may include wastewater treatment plants (especially industrial wastewater for the removal of industrial contaminants), remediation of contaminated and hazardous sites (e.g. landfills, acid mine drainage, SUPERFUND sites (polluted locations requiring a long term response to clean up hazardous material contaminations) etc.), freshwater reservoirs for algal control and removal of pathogens and emerging contaminants, marine environments contaminated by shipping activities to take advantage of the high conductivity of seawater (acting as a natural electrolyte), and/or green buildings (e.g. for decentralized treatment of greywater). In one example, the technology as described in the present disclosure can be used to degrade and mineralize biorefractory solutions such as industrial wastewater or disinfect and control algal blooms in reservoirs by making use of natural sunlight with very fast kinetics and very high percentage removal (>96.5%) in a cost effective way.

Regarding the MSPER, it may comprise 4 main elements: (i) an electrolytic cell, (ii) a motion system, (iii) an energy supply & storage system and (iv) a supporting structure. Different electrodes making use of conductive materials, either opaque, translucent or transparent (to facilitate the penetration of sunlight), may be tested. A beachhead application which utilizes the present subject matter may be sought. This may be supported by a comprehensive technical-economic analysis and/or a pilot installation may be implemented.

Other advantages of the technology developed is the portability and non-reliance on a centralized power supply. This falls right within the interests of those focusing on urban solutions and sustainability, and the development of resilient engineering systems. With the uncertainty in demographic changes and disruptive threats (climate change, terrorist threat, end of oil etc.), the subject matter of the present disclosure may serve as a solution that can assist in the preservation of water sources.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

For example, while in the described example embodiments the anode is optically pervious, alternatively or additionally the cathode may be optically pervious in different embodiments. For example, a transparent carbon cathode such as graphene coated on glass or quartz may be used.

The invention claimed is:

1. A photoelectrochemical cell for wastewater treatment comprising:
at least one cathode and at least one anode, wherein the anode comprises a material configured for an anodic oxidation reaction in the presence of the wastewater, wherein at least one of the anode and cathode comprises an optically pervious material; and
a chamber having a base portion and a wall portion extending from the base portion, and an inlet and an outlet at the wall portion of the chamber, wherein the inlet and the outlet are in fluid communication with the chamber and are disposed at opposing ends of the chamber, where the base portion of the chamber comprises two or more openings, the openings arranged in order of increasing cross-sectional area with increasing distance from the inlet to the outlet;

wherein:

the anode and the cathode are disposed in the chamber;

the cathode is configured for cooperating with the anode to drive one or more cathodic reduction reactions in the presence of the wastewater; and the anode and the cathode are disposed to allow irradiation of at least a portion of a space between the anode and the cathode by a light source through the optically pervious material to activate at least one photon based reaction in the wastewater.

2. The photoelectrochemical cell according to claim 1, wherein the material is selected from the group consisting of fluorine-doped tin oxide (FTO), indium tin oxide (ITO), boron-doped diamond (BDD), tin oxide ($SnO_2$), lead oxide ($PbO_2$), $Ti_4O_7$ and combinations thereof.

3. The photoelectrochemical cell according to claim 1, wherein the optically pervious material comprises glass or quartz.

4. The photoelectrochemical cell according to claim 1, wherein the one or more cathodic reduction reactions comprise reduction of oxygen, reduction of $Fe^{3+}$ and/or electro-activation of hydrogen peroxide.

5. The photoelectrochemical cell according to claim 1, wherein the anode and the cathode are disposed to face each other in the photoelectrochemical cell while remaining spaced apart by a distance of about 10 mm to about 30 mm or a distance of less than about 10 mm.

6. The photoelectrochemical cell according to claim 1, further comprising an optical medium configured to increase incident light on the optically pervious material.

7. The photoelectrochemical cell according to claim 1, further comprising an aerator configured to provide oxygen gas to the photoelectrochemical cell, wherein the aerator is in fluid communication with the one or more openings at the base portion of the chamber.

8. The photoelectrochemical cell according to claim 1, further comprising a dispensing device configured to dispense an aqueous solution comprising $Fe^{2+}$, $Fe^{3+}$ and/or ferric hydroxyl complexes to the photoelectrochemical cell.

9. A method of fabricating a photoelectrochemical cell, the method comprising:

providing at least one cathode and at least one anode, wherein the anode comprises a material configured for an anodic oxidation in the presence of wastewater, wherein at least one of the anode and cathode comprises an optically pervious material, configuring the cathode for cooperating with the anode to drive one or more cathodic reduction reactions in the presence of said wastewater, and disposing the anode and the cathode to allow irradiation of at least a portion of a space between the anode and the cathode by a light source through the optically pervious material to activate at least one photon based reaction in said wastewater, wherein disposing the anode and the cathode comprises providing a chamber having a base portion and a wall portion extending from the base portion, and disposing the anode and the cathode in the chamber, where providing the chamber comprises:

forming an inlet and an outlet at the wall portion of the chamber, wherein the inlet and the outlet are in fluid communication with the chamber and are disposed at opposing ends of the chamber, and forming two or more openings in the base portion, and wherein forming said two or more openings comprises forming the openings in order of increasing cross-sectional area with increasing distance from the inlet to the outlet.

10. The method according to claim 9, wherein disposing the anode and the cathode comprises arranging the anode and the cathode to face each other in the photoelectrochemical cell while remaining spaced apart by a distance of about 10 mm to about 30 mm or a distance of less than about 10 mm.

11. The method according to claim 9, wherein providing the chamber comprises integrally forming the chamber by 3D printing.

12. The method according to claim 9, further comprising providing an optical medium configured to increase incident light on the optically pervious material.

13. The method according to claim 9, further comprising providing an aerator configured to provide oxygen gas to the photoelectrochemical cell, wherein providing the aerator comprises disposing the aerator to be in fluid communication with the one or more openings at the base portion of the chamber.

14. The method according to claim 9, further comprising providing a dispensing device configured to dispense an aqueous solution comprising $Fe^{2+}$, $Fe^{3+}$ and/or ferric hydroxyl complexes to the photoelectrochemical cell.

* * * * *